(12) United States Patent
Nakayama et al.

(10) Patent No.: US 6,894,562 B2
(45) Date of Patent: May 17, 2005

(54) HIGH-FREQUENCY AMPLIFIER, FEED-FORWARD AMPLIFIER AND DISTORTION COMPENSATING AMPLIFIER

(75) Inventors: Masatoshi Nakayama, Tokyo (JP); Kenichi Horiguchi, Tokyo (JP); Yukio Ikeda, Tokyo (JP); Satoshi Kunugi, Tokyo (JP); Yuji Sakai, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 225 days.

(21) Appl. No.: 10/111,411
(22) PCT Filed: Aug. 30, 2001
(86) PCT No.: PCT/JP01/07492
§ 371 (c)(1),
(2), (4) Date: May 6, 2002
(87) PCT Pub. No.: WO02/21685
PCT Pub. Date: Mar. 14, 2002

(65) Prior Publication Data
US 2002/0171477 A1 Nov. 21, 2002

(30) Foreign Application Priority Data
Sep. 5, 2000 (JP) ........................................ 2000-269077

(51) Int. Cl.[7] .............................. H03F 3/60; H03F 3/68
(52) U.S. Cl. ..................... 330/53; 330/124 R; 330/286; 330/295
(58) Field of Search ............................... 330/53, 124 R, 330/151, 286, 295; 333/1.1

(56) References Cited

U.S. PATENT DOCUMENTS
4,985,686 A * 1/1991 Davidson et al. ....... 330/124 R

FOREIGN PATENT DOCUMENTS
FR 1999-011344 3/1999
JP 52-91632 8/1977
JP 58-40908 3/1983
JP 61-258513 11/1986
JP 62-289004 12/1987
JP 11527/1993 2/1993
JP 8-8660 1/1996
JP 9-284061 10/1997
JP 11-041118 2/1999

OTHER PUBLICATIONS

Masayoshi Aikawa et al.: "Monolithic microwave integrated circuit", The Institute of Electronics, Informations and Communication Engineers, p. 74.

Takagi et al.: "Basic and applications of MMIC technique", Published by REALIZE Company, p. 155.

Kazuhisa Yamauchi et al.: "A microwave miniaturized linearizer using a parallel diode with a bias feed resistance", IEEE Transactions on Microwave Theory and Techniques, vol. 45, No. 12, pp. 2431–2435 12/97.

* cited by examiner

Primary Examiner—Steven J. Mottola
(74) Attorney, Agent, or Firm—Oblon, Spivak, McClelland, Maier & Neustadt, P.C.

(57) ABSTRACT

A divider 3 for dividing and distributing a high-frequency signal input from an input terminal 1 to two output sides, a main amplifying unit 4, connected to one output side of the divider 3, for amplifying one high-frequency signal output from the divider 3, a subsidiary amplifying unit 5, connected to the other output side of the divider 3, for performing no operation in case of a low instantaneous electric power of the other high-frequency signal output from the divider 3 and amplifying the other high-frequency signal in case of a high instantaneous electric power of the other high-frequency signal and a circulator 6 for injecting the high-frequency signal amplified in the subsidiary amplifying unit 5 into the output side of the main amplifying unit 4 and injecting the high-frequency signal amplified in the main amplifying unit 4 into an output terminal 2 are arranged.

23 Claims, 17 Drawing Sheets

HIGH-FREQUENCY AMPLIFIER, FEED-FORWARD AMPLIFIER AND DISTORTION COMPENSATING AMPLIFIER

TECHNICAL FIELD

The present invention relates to a high-frequency amplifier operated at a high efficiency even in an operation state of high back-off, a feed-forward amplifier and a distortion compensating amplifier used for the high-frequency amplifier.

BACKGROUND ART

A high-frequency signal belonging to a communication band such as a very high frequency (VHF) band, an ultrahigh frequency (UHF) band or a microwave band is modulated according to a modulation method such as quadrature phase shift keying (QPSK) or quadrature amplitude modulation (QAM).

In general, an amplitude of the high-frequency signal is changed with time in every time period corresponding to a band of a modulation wave. In other words, an envelope of the high-frequency signal is changed with time. In cases where a plurality of signals are simultaneously amplified in a base station for mobile communication, an envelope of the high-frequency signal is changed with time.

FIG. 1 is a view showing an example of a waveform of a high-frequency signal of which an envelope is changed with time. An X axis indicates time, and a Y axis indicates electric power of a high-frequency signal.

As shown in FIG. 1, an envelope of a high-frequency signal is changed with time, and it is realized that a peak electric power of the high-frequency signal at a maximum envelope obtained in an instant is higher than an average electric power of the high-frequency signal. A ratio of the peak electric power to the average electric power is called a crest factor or a peak electric power ratio. The crest factor of the high-frequency signal used for a base station of recent mobile communication sometimes reaches 10 dB.

Therefore, in cases where it is intended to amplify a high-frequency signal having a high crest factor without saturating the crest factor at a peak electric power of the high-frequency signal, it is required to use a high-frequency amplifier in which a difference (so-called back-off) between an average output electric power at an actual operation of the high-frequency amplifier and a saturation electric power can be sufficiently heightened.

In general, in a high-frequency amplifier, an internal output matching circuit is adjusted according to required characteristics of a high-frequency signal, and output side load impedance conditions seen from an amplifying element such as a field-effect transistor (FET) are optimized. For example, there is a case where the load impedance conditions are optimized so as to heighten efficiency in the high-frequency amplifier, and there is another case where the load impedance conditions are optimized so as to heighten the saturation electric power.

However, as is described in a literature "Monolithic Microwave Integrated Circuit" (written by AIKAWA et al., the Institute of Electrics, Information and Communication Engineers, p. 74, FIGS. 3–4) or a literature "Basis and Applications of MMIC Technique" (written by TAKAGI and ITOU, published by REALIZE company, p. 155, FIGS. 8–39(a)), a load impedance condition (or high efficiency matching) corresponding to the high efficiency do not generally agree with a load impedance conditions (or high output matching) corresponding to the high saturation electric power.

FIG. 2 is a view schematically showing both a change of a saturation electric power and a change of an efficiency on a Smith chart with respect to a load impedance seen from an amplifying element of a high-frequency amplifier. Solid lines indicate contour lines of the saturation electric power, and dotted lines indicate contour lines of the efficiency.

In FIG. 2, a load impedance corresponding to a maximum saturation electric power is indicated by a symbol x, and a load impedance corresponding to a maximum efficiency is indicated by a symbol •. The load impedance corresponding to the maximum saturation electric power does not agree with the load impedance corresponding to the maximum efficiency, and the load impedance corresponding to the maximum efficiency is changed with respect to an output electric power.

Accordingly, a great portion of the instantaneous electric power of the high-frequency signal is cut off on the load impedance condition corresponding to the high efficiency. As a result, a large amount of disturbance wave is leaked to an adjacent channel, the transmitted high-frequency signal is degraded, and transmission error is increased.

In contrast, on the load impedance condition corresponding to the high saturation electric power, no great portion of the instantaneous electric power of the high-frequency signal is cut off, but the efficiency in the high-frequency amplifier is undesirably lowered.

Because of the above-described reasons, it is difficult to obtain a high-frequency amplifier in which the load impedance condition corresponding to the high saturation electric power and the load impedance condition corresponding to the high efficiency are satisfied. In other words, the efficiency in the high-frequency amplifier is considerably lowered on condition that the back-off is high. For example, in case of a simple class-B amplifier, a maximum efficiency in a saturation operation is theoretically equal to 78%, and a maximum efficiency in an operation of the back-off of 10 dB is theoretically equal to about 25%. Therefore, though a high-frequency amplifier of a base station is required to amplify a high-frequency signal of a high crest factor at low distortion, the efficiency in the high-frequency amplifier is lowered due to the low maximum efficiency in the operation at the back-off of 10 dB.

To solve the above-described problem, a conventional high-frequency amplifier is known, where the load impedance in the conventional high-frequency amplifier is changed by using a switch.

FIG. 3 is a view showing the configuration of a conventional high-frequency amplifier disclosed in the Published Unexamined Japanese Patent Application No. H9-284061 (1997), and FIG. 4 is a view showing the configuration of an output matching circuit used for the conventional high-frequency amplifier.

In FIG. 3, 101 indicates an amplifying element such as a field-effect transistor (FET) or a bipolar junction transistor (BJT). 102 indicates a power supply circuit for applying a direct-current voltage to the amplifying element 101. 103 indicates an output matching circuit. 104 indicates a load.

The output matching circuit 103 has the configuration shown in FIG. 4 as an example and comprises a transformer 105 for the impedance change and a switch 106 for changing over from a tap terminal of the transformer 105 to another tap terminal. A tap terminal selected by the switch 106 is changed to another tap terminal according to a control signal Sct1, and a value of a load impedance $Z_{in}$ obtaining by seeing the output matching circuit 103 from the amplifying element 101 is changed.

In cases where the output electric power is low, the switch 106 selects a tap terminal corresponding to a load impedance condition of the high frequency. In cases where an output electric power is high, the switch 106 selects a tap terminal corresponding to a load impedance condition of the high output electric power, that is, a load impedance heightening the saturation electric power. Therefore, an excellent efficiency can be obtained regardless of a value of the output electric power.

Also, similar high-frequency amplifiers are disclosed in the Published Unexamined Japanese Patent Application No. H5-54725 (1993) and the Published Unexamined Japanese Patent Application No. H11-41118 (1999). In the conventional technique of these applications, the selection in a switch of a matching circuit is changed, a load impedance is changed by using a variable capacitive element arranged in the matching circuit, and an excellent efficiency is obtained regardless of a value of the output electric power. Because the conventional high-frequency amplifier has the above-described configuration, a problem has arisen that it is difficult to obtain a high-frequency amplifier operated at a sufficiently high saturation electric power and an excellent efficiency while following the change of an envelop of a high-frequency signal.

As is described before, in the conventional technique, because the selector switch or the variable capacitive element is arranged in the conventional high-frequency amplifier, a reaction time for the change of the load impedance is long, and the load impedance cannot be changed in accordance with a time change of the envelope based on a modulation wave. Therefore, as is described in each application of the conventional technique, it is supposed that the conventional high-frequency amplifier is used for the purpose of selecting one mode from a high output mode and a low output mode in a transmitter, and the conventional high-frequency amplifier is not used for the purpose of changing the load impedance in accordance with a time change of the envelope of the high-frequency signal.

Also, even though the change-over of the switch is performed at high speed, it is difficult to obtain a switch and a variable element which have characteristics of electric power resistance sufficiently possible to be used for an output circuit of a high-frequency amplifier and are operated at low loss. As a result, a problem has arisen that an effect of the improvement of the efficiency is not sufficient.

The present invention is provided to solve the above-described problem, and the object of the present invention is to provide a high-frequency amplifier in which an output load impedance is changed in accordance with a time change of an envelope based on a modulation wave and which has a sufficiently high saturation electric power and excellent efficiency.

In other words, the object of the present invention is to provide a high-frequency amplifier in which an operation is performed at high efficiency even in an operation state of a high back-off, that is, even in an operation state of an output electric power lower than a saturation electric power.

Also, the object of the present invention is to provide a feed-forward amplifier and a distortion compensating amplifier in which an operation is performed at a high saturation electric power and an excellent efficiency.

SUMMARY OF THE INVENTION

A high-frequency amplifier according to the present invention includes subsidiary amplifying means for performing an amplifying operation for a high-frequency signal distributed and input only in a case where an instantaneous electric power of the high-frequency signal is high, and main amplifying means for always performing an amplifying operation for a high-frequency signal distributed and input. The high-frequency signal amplified by the subsidiary amplifying means is injected into an output side of the main amplifying means, and the high-frequency signal amplified by the main amplifying means is output. Therefore, an output load impedance can be changed in accordance with a change of an envelope of a modulated high-frequency signal. Accordingly, a high-frequency amplifier operated at a sufficiently high saturation electric power and an excellent efficiency can be provided by changing the output load impedance of the high-frequency amplifier in accordance with the change of the envelope caused by the modulation. In other words, a high-frequency amplifier operated at high efficiency even in a high back-off operation state, that is, in a low output electric power as compared with a saturation electric power can be provided.

A high-frequency amplifier according to the present invention includes first distributing means for distributing a high-frequency signal input from an input terminal, main amplifying means for always performing an amplifying operation for one high-frequency signal distributed by the first distributing means, subsidiary amplifying means for performing an amplifying operation for the other high-frequency signal distributed by the first distributing means only in a case where an instantaneous electric power of the high-frequency signal is high, and a circulator for injecting the high-frequency signal amplified by the subsidiary amplifying means into an output side of the main amplifying means and outputting the high-frequency signal amplified by the main amplifying means through an output terminal. Therefore, an output load impedance can be changed in accordance with a change of an envelope of a modulated high-frequency signal. Accordingly, the high-frequency amplifier, which is operated as a high efficiency type amplifier in case of a low instantaneous electric power of the high-frequency signal and is operated as an amplifier having a high saturation electric power in case of a high instantaneous electric power of the high-frequency signal, can be provided.

A high-frequency amplifier according to the present invention includes first distributing means for distributing a high-frequency signal input from an input terminal to two lines, second distributing means for producing two high-frequency signals having a phase difference of 90 degrees from each other from the high-frequency signal of one line distributed by the first distributing means and distributing the two high-frequency signals, first main amplifying means for always performing an amplifying operation for one high-frequency signal distributed by the second distributing means, second main amplifying means for always performing an amplifying operation for the other high-frequency signal distributed by the second distributing means, subsidiary amplifying means for amplifying the high-frequency signal of the other line distributed by the first distributing means only in a case where an instantaneous electric power of the high-frequency signal is high, and a first 90-degree hybrid for injecting the high-frequency signal amplified by the subsidiary amplifying means into both an output side of the first main amplifying means and an output side of the second main amplifying means, combining the high-frequency signal amplified by the first main amplifying means and the high-frequency signal amplified by the second main amplifying means and outputting a combined high-frequency signal through an output terminal. Therefore, loss in the high-frequency signal can be reduced, the efficiency in the high-frequency amplifier can be improved, and the cost of manufacturing the high-frequency amplifier can be reduced.

A high-frequency amplifier according to the present invention further includes first amplitude and phase adjusting means for adjusting both an amplitude and a phase of the high-frequency signal passing through the subsidiary amplifying means. Therefore, both the amplitude and the phase of the high-frequency signal injected into the main amplifying means can be optimized, and the efficiency in the high-frequency amplifier can be further improved by adjusting an apparent load impedance seen from the main amplifying means in case of a high instantaneous electric power of the high-frequency signal.

A high-frequency amplifier according to the present invention further includes first amplitude and phase adjusting means for adjusting both an amplitude and a phase of the high-frequency signal passing through the subsidiary amplifying means. Therefore, both the amplitude and the phase of the high-frequency signal injected into the main amplifying means can be optimized, and the efficiency in the high-frequency amplifier can be further improved by adjusting an apparent load impedance seen from the main amplifying means in case of a high instantaneous electric power of the high-frequency signal.

A high-frequency amplifier according to the present invention further includes delaying means for delaying either the high-frequency signal passing through the main amplifying means or the high-frequency signal passing through the subsidiary amplifying means by a delay time. Therefore, a delay time of the high-frequency signal generated on a line on the side of the main amplifying means can agree with a delay time of the high-frequency signal generated on a line on the side of the subsidiary amplifying means, and the effect of injecting the high-frequency signal from the subsidiary amplifying means to the main amplifying means can be obtained over a wide frequency band.

A high-frequency amplifier according to the present invention further includes delaying means for delaying either both the high-frequency signal passing through the first main amplifying means and the high-frequency signal passing through the second main amplifying means or the high-frequency signal passing through the subsidiary amplifying means by a delay time. Therefore, a delay time of the high-frequency signal generated on a line on the side of each of the first main amplifying means and the second main amplifying means can agree with a delay time of the high-frequency signal generated on a line on the side of the subsidiary amplifying means, and the effect of injecting the high-frequency signal from the subsidiary amplifying means to the main amplifying means can be obtained over a wide frequency band.

A high-frequency amplifier according to the present invention further includes a frequency equalizer for changing either a frequency characteristic of the high-frequency signal passing through the main amplifying means or a frequency characteristic of the high-frequency signal passing through the subsidiary amplifying means. Therefore, a frequency characteristic of the high-frequency signal given on a line on the side of the main amplifying means can agree with a frequency characteristic of the high-frequency signal given on a line on the side of the subsidiary amplifying means, and the effect of injecting the high-frequency signal from the subsidiary amplifying means to the main amplifying means can be obtained over a wide frequency band.

A high-frequency amplifier according to the present invention further includes a frequency equalizer for changing either both a frequency characteristic of the high-frequency signal passing through the first main amplifying means and a frequency characteristic of the high-frequency signal passing through the second main amplifying means or a frequency characteristic of the high-frequency signal passing through the subsidiary amplifying means. Therefore, a frequency characteristic of the high-frequency signal given on a line on the side of each of the first main amplifying means and the second main amplifying means can agree with a frequency characteristic of the high-frequency signal given on a line on the side of the subsidiary amplifying means, and the effect of injecting the high-frequency signal from the subsidiary amplifying means to the main amplifying means can be obtained over a wide frequency band.

A high-frequency amplifier according to the present invention further includes AM-AM/PM adjusting means for adjusting both a change of the instantaneous electric power and a passing phase characteristic of the high-frequency signal output from the subsidiary amplifying means according to a change of the instantaneous electric power of the high-frequency signal input to the subsidiary amplifying means. Therefore, a level of the electric power for the operation of the subsidiary amplifying means and an output electric power corresponding to an input electric power can be optimized, the signal injected into the main amplifying means can be optimized, and the efficiency in the whole high-frequency amplifier can be improved.

A high-frequency amplifier according to the present invention further includes AM-AM/PM adjusting means for adjusting both a change of the instantaneous electric power and a passing phase characteristic of the high-frequency signal output from the subsidiary amplifying means according to a change of the instantaneous electric power of the high-frequency signal input to the subsidiary amplifying means. Therefore, a level of the electric power for the operation of the subsidiary amplifying means and an output electric power corresponding to an input electric power can be optimized, the signal injected into each of the first main amplifying means and the second main amplifying means can be optimized, and the efficiency in the whole high-frequency amplifier can be improved.

In a high-frequency amplifier according to the present invention, the AM-AM/PM adjusting means includes two condensers serially connected to each other between an input terminal of the AM-AM/PM adjusting means and an output terminal of the AM-AM/PM adjusting means, a diode disposed between a connection point of the condensers and the ground, and a direct-current bias power source connected to the connection point of the condensers through a bias resistor. Therefore, a level of the electric power for the operation of the subsidiary amplifying means and an output electric power corresponding to an input electric power can be optimized, the signal injected into the main amplifying means can be optimized, and the efficiency in the whole high-frequency amplifier can be improved.

In a high-frequency amplifier according to the present invention, the AM-AM/PM adjusting means includes two condensers serially connected to each other between an input terminal of the AM-AM/PM adjusting means and an output terminal of the AM-AM/PM adjusting means, a diode disposed between a connection point of the condensers and the ground, and a direct-current bias power source connected to the connection point of the condensers through a bias resistor. Therefore, a level of the electric power for the operation of the subsidiary amplifying means and an output electric power corresponding to an input electric power can be optimized, the signal injected into each of the first main amplifying means and the second main amplifying means can be optimized, and the efficiency in the whole high-frequency amplifier can be improved.

In a high-frequency amplifier according to the present invention, the AM-AM/PM adjusting means includes third distributing means for distributing a portion of the high-frequency signal, first amplitude detecting means for detecting an amplitude of the high-frequency signal distributed by the third distributing means, second amplitude and phase adjusting means for adjusting both an amplitude and a phase of the high-frequency signal passing the third distributing means, and control means for controlling the second amplitude and phase adjusting means by referring to the amplitude of the high-frequency signal detected by the first amplitude detecting means.

Therefore, a level of the electric power for the operation of the subsidiary amplifying means and a value of an output electric power corresponding to an input electric power can be optimized, the signal injected into the main amplifying means can be optimized, and the efficiency in the whole high-frequency amplifier can be improved.

In a high-frequency amplifier according to the present invention, the AM-AM/PM adjusting means includes third distributing means for distributing a portion of the high-frequency signal, first amplitude detecting means for detecting an amplitude of the high-frequency signal distributed by the third distributing means, second amplitude and phase adjusting means for adjusting an amplitude and a phase of the high-frequency signal passing the third distributing means, and control means for controlling the second amplitude and phase adjusting means by referring to the amplitude of the high-frequency signal detected by the first amplitude detecting means.

Therefore, a level of the electric power for the operation of the subsidiary amplifying means and a value of an output electric power corresponding to an input electric power can be optimized, the signal injected into each of the first main amplifying means and the second main amplifying means can be optimized, and the efficiency in the whole high-frequency amplifier can be improved.

A high-frequency amplifier according to the present invention further includes demultiplexing means for demultiplexing a fundamental wave component and a harmonic wave component of the high-frequency signal amplified by the subsidiary amplifying means from each other, third amplitude and phase adjusting means for adjusting both an amplitude and a phase of the harmonic wave component demultiplexed by the demultiplexing means, and multiplexing means, disposed between the demultiplexing means and the circulator, for multiplexing the fundamental wave component demultiplexed by the demultiplexing means and the harmonic wave component adjusted by the third amplitude and phase adjusting means with each other. Therefore, a load impedance of the main amplifying means for the harmonic wave component can be adjusted, and the efficiency in the main amplifying means can be further improved.

A high-frequency amplifier according to the present invention further includes demultiplexing means for demultiplexing a fundamental wave component and a harmonic wave component of the high-frequency signal amplified by the subsidiary amplifying means from each other, third amplitude and phase adjusting means for adjusting both an amplitude and a phase of the harmonic wave component demultiplexed by the demultiplexing means, and multiplexing means, disposed between the demultiplexing means and the first 90-degree hybrid, for multiplexing the fundamental wave component demultiplexed by the demultiplexing means and the harmonic wave component adjusted by the third amplitude and phase adjusting means with each other. Therefore, a load impedance of each of the first main amplifying means and the second main amplifying means for the harmonic wave component can be adjusted, and the efficiency in the main amplifying means can be further improved.

A high-frequency amplifier according to the present invention further includes demultiplexing means for demultiplexing a fundamental wave component and a harmonic wave component of the high-frequency signal amplified by the subsidiary amplifying means from each other, third amplitude and phase adjusting means for adjusting both an amplitude and a phase of the harmonic wave component demultiplexed by the demultiplexing means, and multiplexing means, disposed between the circulator and the subsidiary amplifying means, for multiplexing the fundamental wave component demultiplexed by the demultiplexing means and the harmonic wave component adjusted by the third amplitude and phase adjusting means with each other. Therefore, loss, size and cost in the circulator can be reduced, a load impedance of the main amplifying means for the harmonic wave component can be adjusted, and the efficiency in the main amplifying means can be further improved.

A high-frequency amplifier according to the present invention further includes demultiplexing means for demultiplexing a fundamental wave component and a harmonic wave component of the high-frequency signal amplified by the subsidiary amplifying means from each other and outputting the fundamental wave component to the first 90-degree hybrid, third amplitude and phase adjusting means for adjusting both an amplitude and a phase of the harmonic wave component demultiplexed by the demultiplexing means, a second 90-degree hybrid for distributing the harmonic wave component adjusted by the third amplitude and phase adjusting means to two lines, first multiplexing means, disposed between the first 90-degree hybrid and the first main amplifying means, for multiplexing the harmonic wave component of one line output from the second 90-degree hybrid and the fundamental wave component output through the first 90-degree hybrid with each other, and second multiplexing means, disposed between the first 90-degree hybrid and the second main amplifying means, for multiplexing the harmonic wave component of the other line output from the second 90-degree hybrid and the fundamental wave component output through the first 90-degree hybrid with each other. Therefore, the loss is reduced, and the efficiency can be improved.

A high-frequency amplifier according to the present invention further includes an isolator, disposed between the circulator and the output terminal or between a first 90-degree hybrid and the output terminal, for outputting the high-frequency signal output from the circulator or the first 90-degree hybrid to the output terminal.

Therefore, a change of characteristics of the subsidiary amplifying means due to a reflected wave can be prevented, and a high-frequency amplifier stably operated at high efficiency can be provided.

A high-frequency amplifier according to the present invention further includes an isolator, disposed between a circulator and the output terminal or between the first 90-degree hybrid and the output terminal, for outputting the high-frequency signal output from the circulator or the first 90-degree hybrid to the output terminal. Therefore, a change of characteristics of the subsidiary amplifying means due to a reflected wave can be prevented, and a high-frequency amplifier stably operated at high efficiency can be provided.

A high-frequency amplifier according to the present invention further includes an isolator, disposed between the subsidiary amplifying means and the circulator, for making the high-frequency signal amplified by the subsidiary amplifying means pass through the circulator. Therefore, a change of characteristics of the subsidiary amplifying means due to a reflected wave can be prevented while reducing the loss, and a high-frequency amplifier stably operated at high efficiency can be provided.

A high-frequency amplifier according to the present invention further includes an isolator, disposed between the subsidiary amplifying means and the first 90-degree hybrid, for making the high-frequency signal amplified by the subsidiary amplifying means pass through the first 90-degree hybrid. Therefore, even though characteristics of the first main amplifying means do not perfectly agree with those of the second main amplifying means, the inflow of the electric power into the outside of the subsidiary amplifying means can be prevented, and the isolator can contribute to a stable operation of the high-frequency amplifier at high efficiency.

A high-frequency amplifier according to the present invention further includes base band processing means for processing a base band signal input from the input terminal, and first frequency changing means for changing a frequency of the base band signal processed by the base band processing means to produce both the high-frequency signal input to the main amplifying means and the high-frequency signal input to the subsidiary amplifying means. Therefore, the processing can be performed in a low frequency band in which the design is easy, a degree of freedom in the configuration of circuits, the high-frequency amplifier can be formed of circuits easily adjusted and high precision type circuits.

A high-frequency amplifier according to the present invention further includes base band processing means for processing a base band signal input from the input terminal, and first frequency changing means for changing a frequency of the base band signal processed by the base band processing means to produce both the high-frequency signal input to the main amplifying means and the high-frequency signal input to the subsidiary amplifying means. Therefore, the processing can be performed in a low frequency band in which the design is easy, a degree of freedom in the configuration of circuits, the high-frequency amplifier can be formed of circuits easily adjusted and high precision type circuits.

In a high-frequency amplifier according to the present invention, the base band processing means includes fourth distributing means for distributing the base band signal input from the input terminal to two lines, second amplitude detecting means for detecting an amplitude of the base band signal of one line distributed by the fourth distributing means, fourth amplitude and phase adjusting means for adjusting both an amplitude and a phase of the base band signal output from the second amplitude detecting means, and control means for controlling the fourth amplitude and phase adjusting means by referring to both the amplitude of the base band signal detected by the second amplitude detecting means and data prepared in advance. Therefore, a degree of freedom in the adjustment can be heightened, the processing with further high precision can be performed, and the base band processing means can contribute to the improvement of the efficiency in the high-frequency amplifier.

In a high-frequency amplifier according to the present invention, the base band processing means includes fourth distributing means for distributing the base band signal input from the input terminal as two lines, second amplitude detecting means for detecting an amplitude of the base band signal of one line distributed by the fourth distributing means, fourth amplitude and phase adjusting means for adjusting both an amplitude and a phase of the base band signal output from the second amplitude detecting means, and control means for controlling the fourth amplitude and phase adjusting means by referring to both the amplitude of the base band signal detected by the second amplitude detecting means and data prepared in advance. Therefore, a degree of freedom in the adjustment can be heightened, the processing with further high precision can be performed, and the base band processing means can contribute to the improvement of the efficiency in the high-frequency amplifier.

A high-frequency amplifier according to the present invention further includes fifth distributing means for distributing the high-frequency signal output from the subsidiary amplifying means, and second frequency changing means for changing a frequency of the high-frequency signal distributed by the fifth distributing means to produce a base band signal. The control means renews data prepared in advance by referring to the base band signal of which the frequency is changed by the second frequency changing means. Therefore, even though characteristics of the subsidiary amplifying means are changed, the optimum control can be always performed, and a high-frequency amplifier operated at high efficiency can be provided. Also, the high-frequency amplifier can be monitored or controlled from a remote place by transmitting data of the control means to the remote place or receiving data of the control means from the remote place.

A high-frequency amplifier according to the present invention further includes fifth distributing means for distributing the high-frequency signal output from the subsidiary amplifying means, and second frequency changing means for changing a frequency of the high-frequency signal distributed by the fifth distributing means to produce a base band signal. The control means renews data prepared in advance by referring to the base band signal of which the frequency is changed by the second frequency changing means. Therefore, even though characteristics of the subsidiary amplifying means are changed, the optimum control can be always performed, and a high-frequency amplifier operated at high efficiency can be provided. Also, the high-frequency amplifier can be monitored or controlled from a remote place by transmitting data of the control means to the remote place or receiving data of the control means from the remote place.

A feed-forward amplifier according to the present invention includes a distortion extracting loop for extracting distortion of a high-frequency signal input from an input terminal, and a distortion canceling loop for compensating for the distortion of the high-frequency signal by using the distortion extracted by the distortion extracting loop. Therefore, a feed-forward amplifier operated at high efficiency and further low distortion can be provided.

BEST MODE FOR CARRYING OUT THE INVENTION

Hereinafter, the best mode for carrying out the present invention will now be described with reference to the accompanying drawings to explain the present invention in more detail.

Embodiment 1

Figure 1:
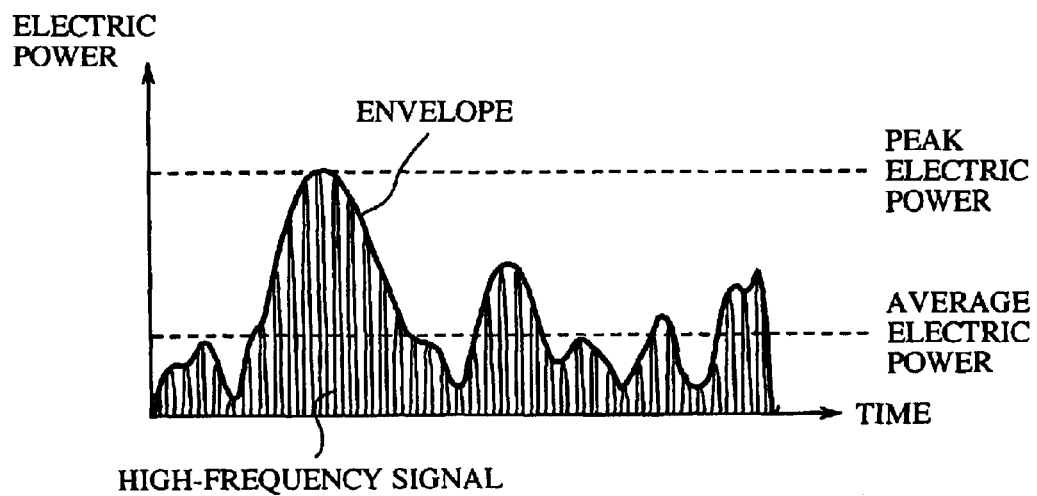
FIG. 1 is a view showing an example of a waveform of a high-frequency signal of which an envelope is changed with time.
Figure 2:
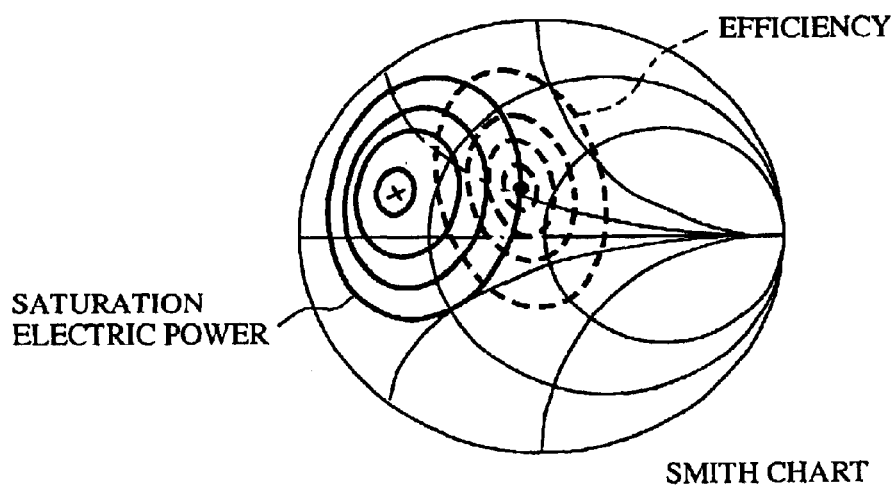
FIG. 2 is a view schematically showing a change of a saturation electric power and a change of an efficiency on a Smith chart with respect to a load impedance seen from an amplifying element of a high-frequency amplifier.
Figure 3:
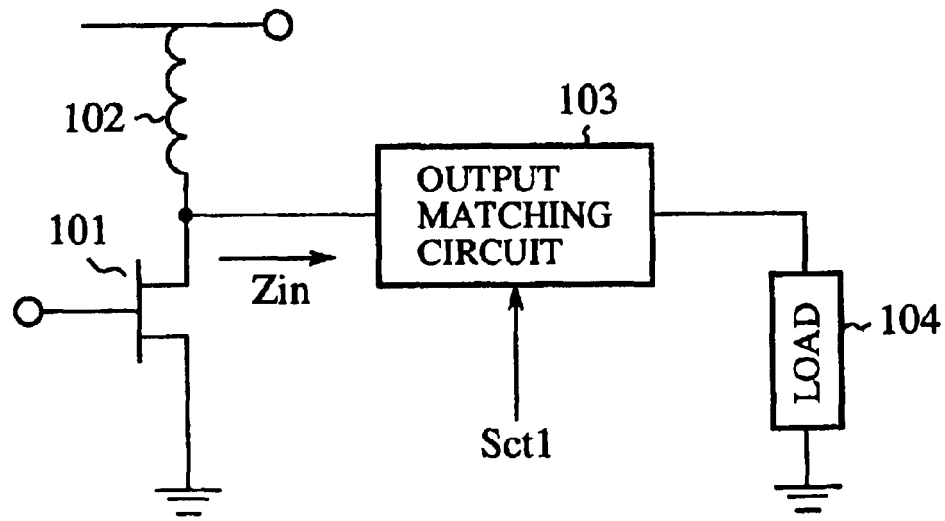
FIG. 3 is a view showing the configuration of a conventional high-frequency amplifier disclosed in the Published Unexamined Japanese Patent Application No. H9-284061 (1997).
Figure 4:
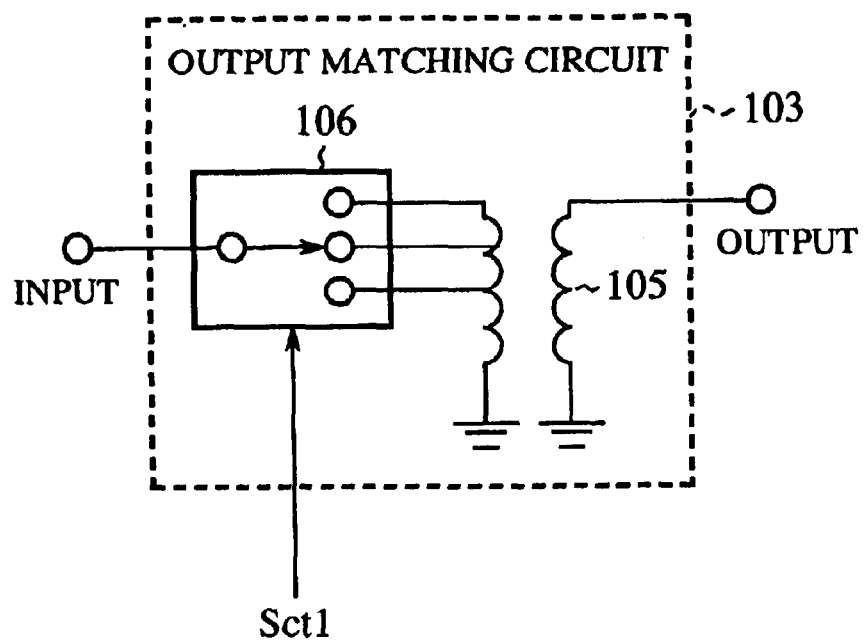
FIG. 4 is a view showing the configuration of an output matching circuit used for the conventional high-frequency amplifier.
Figure 5:
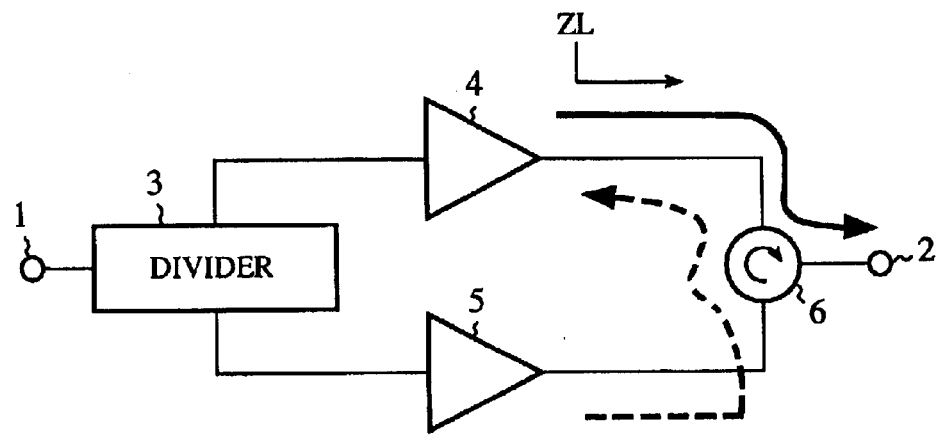
FIG. 5 is a view showing the configuration of a high-frequency amplifier according to a first embodiment of the present invention.

FIG. 5 is a view showing the configuration of a high-frequency amplifier according to a first embodiment of the present invention.

In FIG. 5, 1 indicates an input terminal to which a high-frequency signal is input. 2 indicates an output terminal from which the high-frequency signal is output. 3 indicates a divider (or first distributing means) in which the high-frequency signal input to the input terminal 1 is divided and distributed to two lines of two output sides. 4 indicates a main amplifying unit (or main amplifying means) connected to one output side of the divider 3. 5 indicates a subsidiary amplifying unit (or subsidiary amplifying means) connected to the other output side of the divider 3. 6 indicates a circulator. The circulator 6 is arranged so as to inject the high-frequency signal output from the subsidiary amplifying unit 5 into the output side of the main amplifying unit 4 and to inject the high-frequency signal output from the main amplifying unit 4 into the output terminal 2.

Figure 6:
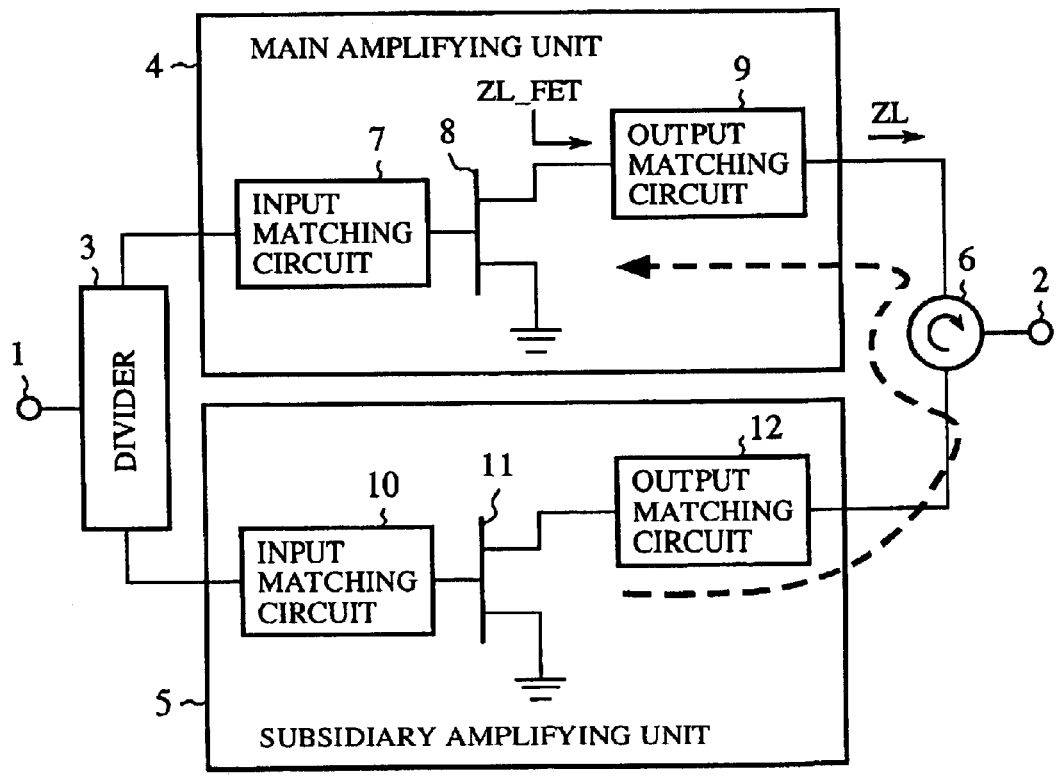
FIG. 6 is a view showing an example of the configuration of both a main amplifying unit and a subsidiary amplifying unit

FIG. 6 is a view showing an example of the configuration of both the main amplifying unit 4 and the subsidiary amplifying unit 5. The constituent elements, which are the same as those shown in FIG. 5, are indicated by the same reference numerals as those of the constituent elements shown in FIG. 5.

In the main amplifying unit 4 shown in FIG. 6, 7 indicates an input matching circuit connected to one output side of the divider 3. 8 indicates an amplifying element in which the high-frequency signal output from the input matching circuit 7 is amplified. 9 indicates an output matching circuit from which the high-frequency signal amplified in the amplifying element 8 is output to the circulator 6.

Also, in the subsidiary amplifying unit 5 shown in FIG. 6, 10 indicates an input matching circuit connected to the other output side of the divider 3. 11 indicates an amplifying element in which the high-frequency signal output from the input matching circuit 10 is amplified. 12 indicates an output matching circuit from which the high-frequency signal amplified in the amplifying element 11 is output to the circulator 6.

A constituent element, from which a direct current bias is given to each of the amplifying element 8 and the amplifying element 11, is not shown.

The main amplifying unit 4 is an amplifier biased at a so-called class-A, class-AB or class-B, and a high-frequency signal is always amplified in the main amplifying unit 4 regardless of a value of the instantaneous electric power of the high-frequency signal.

In contrast, the subsidiary amplifying unit 5 is an amplifier, for example, biased at a class-C, a high-frequency signal is amplified in the subsidiary amplifying unit 5 only in a case where the instantaneous electric power of the high-frequency signal is heightened due to a change of an envelope of the high-frequency signal modulated, and no high-frequency signal is output from the subsidiary amplifying unit 5 in a case where the instantaneous electric power of the high-frequency signal input to the subsidiary amplifying unit 5 is low.

Next, an operation will be described below.

In a case where the instantaneous electric power of a high-frequency signal input to the main amplifying unit 4 is low, the main amplifying unit 4 is operated, but the subsidiary amplifying unit 5 is not operated. Therefore, a high-frequency signal input to the main amplifying unit 4 through the input terminal 1 and the divider 3 passes through the input matching circuit 7, is amplified in the amplifying element 8 and is output from the output terminal 2 through the output matching circuit 9 and the circulator 6 (an arrow of a solid line shown in FIG. 5).

An impedance ZL obtained by seeing the output side from the main amplifying unit 4 indicates an impedance (for example, 50Ω) in the connection to the output terminal 2. In the main amplifying unit 4, the output matching circuit 9 is designed so as to operate the main amplifying unit 4 at a high efficiency in case of a load impedance ZL of the output side. In detail, a circuit constant of the output matching circuit 9 is determined so as to obtain high efficiency matching with a load impedance ZL_FET obtained by seeing the output side from the amplifying element 8. Therefore, the main amplifying unit 4 is operated at high efficiency in a case where the instantaneous electric power of the high-frequency signal input to the main amplifying unit 4 is low.

In a case where the instantaneous electric power of the high-frequency signal input to the subsidiary amplifying unit 5 is high, the subsidiary amplifying unit 5 is operated with the main amplifying unit 4. Therefore, a high-frequency signal input to the subsidiary amplifying unit 5 through the input terminal 1 and the divider 3 passes through the input matching circuit 10, is amplified in the amplifying element 11 and is injected into the output side of the main amplifying unit 4 (an arrow of a dotted line shown in FIG. 5).

In cases where the output side is seen from the side of the main amplifying unit 4, the output side is seen as if the same high-frequency signal as that output from the main amplifying unit 4 is returned from the output side, and it seems that the load impedance ZL and the load impedance ZL_FET are seemingly changed.

Also, in cases where an amplitude and a phase of the high-frequency signal injected from the subsidiary amplifying unit 5 into the output side of the main amplifying unit 4 while passing through the circulator 6 are set to appropriate values, the output side is seen as if the load impedance ZL obtained by seeing the output side from the main amplifying unit 4 and the load impedance ZL_FET obtained by seeing the output side from the amplifying element 8 are changed to impedances at which the saturation electric power of the main amplifying unit 4 is heightened. Therefore, the saturation electric power of the main amplifying unit 4 is heightened as compared with a case where no high-frequency signal is injected from the subsidiary amplifying unit 5 into the output side of the main amplifying unit 4. Accordingly, the high-frequency signal is amplified in the main amplifying unit 4 without cutting off a great portion of the instantaneous electric power of the high-frequency signal amplified, and the amplified high-frequency signal is output from the output terminal 2 through the circulator 6.

As is described above, in a case where the instantaneous electric power of the high-frequency signal is low, the load impedance of the main amplifying unit 4 is set to a value at which the main amplifying unit 4 is operated at high efficiency on condition that the saturation electric power of the main amplifying unit 4 is low, and the high-frequency amplifier shown in FIG. 5 is operated at high efficiency.

In contrast, in a case where the instantaneous electric power of the high-frequency signal is high, because the high-frequency signal amplified in the subsidiary amplifying unit 5 is injected into the output side of the main amplifying unit 4 through the circulator 6, a load impedance (or an apparent load impedance) obtained by seeing the output side from the amplifying element 8 of the main amplifying unit 4 is seemingly changed, and the saturation electric power of the high-frequency amplifier shown in FIG. 5 is heightened.

Accordingly, the high-frequency amplifier according to the first embodiment is operated so as to obtain a high efficiency even in a low power output operation regardless of the high saturation electric power of the high-frequency amplifier set in a high power output operation.

Differently from the conventional high-frequency amplifier, because the high-frequency amplifier according to the first embodiment has no selector switch or no variable capacitive element, the high-frequency amplifier can be operated while sufficiently following a time change of an envelope, and the load impedance of the output matching circuit 9 can be equivalently changed in accordance with a change of an instantaneous electric power of a modulated wave (or high-frequency signal) though it is substantially impossible for the conventional high-frequency amplifier to be operated in accordance with a change of an instantaneous electric power of a modulated wave (or high-frequency signal).

As a result, a high-frequency amplifier operated at high efficiency even in a low power output operation regardless of the high saturation electric power of the high-frequency amplifier set in a high power output operation. In other words, a high-frequency amplifier having an excellent efficiency even in an operation state of a high back-off can be obtained.

Also, as compared with the conventional high-frequency amplifier, because a selector switch or a variable capacitive element is not used in the high-frequency amplifier according to the first embodiment, a problem in the electric power resistance or a loss due to the selector switch or the variable capacitive element is not caused in the high-frequency amplifier. Therefore, the high-frequency amplifier according to the first embodiment can be applied for a high-frequency amplifier operated at high output power and high efficiency.

Because the subsidiary amplifying unit 5 is formed of a class-C amplifier, the subsidiary amplifying unit 5 is not operated in a case where the instantaneous electric power of the high-frequency signal input to the input terminal 1 is low, and no direct-current electric power is consumed in the subsidiary amplifying unit 5. Accordingly, the efficiency in the whole system composed of the main amplifying unit 4 and the subsidiary amplifying unit 5 is not lowered.

Here, only in a case where the instantaneous electric power of the high-frequency signal input to the subsidiary amplifying unit 5 is high, an amplifying operation is performed in the subsidiary amplifying unit 5 to output the high-frequency signal amplified. In a case where the instantaneous electric power of the high-frequency signal input to the subsidiary amplifying unit 5 is low, no high-frequency signal is output from the subsidiary amplifying unit 5, and it is preferred that the subsidiary amplifying unit 5 is biased so as to sufficiently lower the direct-current electric power consumed in the subsidiary amplifying unit 5. Therefore, it is preferred that the subsidiary amplifying unit 5 is set in a class-C bias state. However, even though the subsidiary amplifying unit 5 is set in a class-B bias state, because the direct-current electric power consumed in the subsidiary amplifying unit 5 is sufficiently low in a case where the instantaneous electric power of the high-frequency signal input to the subsidiary amplifying unit 5 is low, the object of the provision of a high-frequency amplifier operated at high efficiency can be achieved.

Also, in a case where the instantaneous electric power of the high-frequency signal input to the subsidiary amplifying unit 5 is high, an amplified high-frequency signal output from the subsidiary amplifying unit 5 is reflected on the output side of the main amplifying unit 4, and the reflected high-frequency signal is sent to the output terminal 2 as a result and is output as a part of the output electric power of the output high-frequency signal. Therefore, the electric power consumed in the subsidiary amplifying unit 5 is not used wastefully, and the efficiency in the high-frequency amplifier is not lowered by the electric power consumed in the subsidiary amplifying unit 5.

In the above description, the amplifying elements 8 and 11 are used in the main amplifying unit 4 and the subsidiary amplifying unit 5 respectively in one stage. However, it is applicable that a plurality of amplifying elements connected to each other in a plurality of stages be used in each of both the main amplifying unit 4 and the subsidiary amplifying unit 5 or in either the main amplifying unit 4 or the subsidiary amplifying unit 5, and a gain in the high-frequency amplifier can be adjusted.

As is described above, in the first embodiment, the high-frequency amplifier comprises the divider 3 for distributing a high-frequency signal input to the input terminal 1 into two lines of two output sides, the main amplifying unit 4, connected to one output side of the divider 3, for amplifying the high-frequency signal of one line output from the divider 3, the subsidiary amplifying unit 5, connected to the other output side of the divider 3, for performing no operation in a case where the instantaneous electric power of the high-frequency signal input to the input terminal 1 is low and amplifying the high-frequency signal of the other line output from the divider 3 in a case where the instantaneous electric power of the high-frequency signal input to the subsidiary amplifying unit 5 is high, and the circulator 6 for injecting the high-frequency signal amplified in the subsidiary amplifying unit 5 into the output side of the main amplifying unit 4 and injecting the high-frequency signal amplified in the main amplifying unit 4 into the output terminal 2. Therefore, the output load impedance can be changed in accordance with a change of an envelope of a modulated high-frequency signal, the high-frequency amplifier can be operated as an amplifier of a high efficiency in a case where the instantaneous electric power of the high-frequency signal is low, and the high-frequency amplifier can be operated as an amplifier of a high saturation electric power in a case where the instantaneous electric power of the high-frequency signal is high.

Embodiment 2

Figure 7:
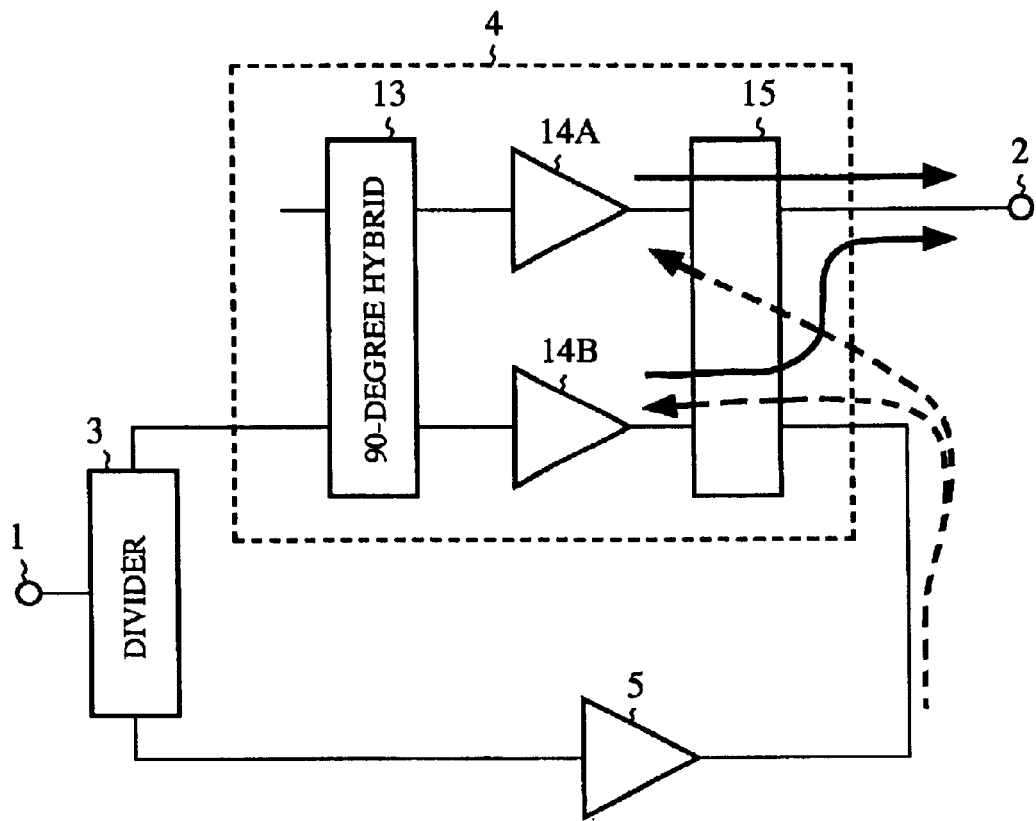
FIG. 7 is a view showing the configuration of a high-frequency amplifier according to a second embodiment of the present invention.

FIG. 7 is a view showing the configuration of a high-frequency amplifier according to a second embodiment of the present invention. The constituent elements, which are the same as those shown in FIG. 5, are indicated by the same reference numerals as those of the constituent elements shown in FIG. 5.

In FIG. 7, 13 indicates a 90-degree hybrid (or second distributing means) in which two high-frequency signals having a phase difference of 90 degrees from each other are produced from the high-frequency signal of one line output from the divider 3 and are distributed to two lines respectively. 14A and 14B indicate two amplifying units (or first main amplifying means and second main amplifying means) in which the two high-frequency signals output from the 90-degree hybrid 13 are respectively amplified. 15 indicates a 90-degree hybrid (or a first 90-degree hybrid). In the 90-degree hybrid 15, the amplified high-frequency signal output from the subsidiary amplifying unit 5 is distributed to two lines, two high-frequency signals of the two lines are injected into the output sides of the amplifying units 14A and 14B respectively, the amplified high-frequency signals output from the amplifying units 14A and 14B respectively are combined with each other, and the combined high-frequency signal is output through the output terminal 2.

In the second embodiment, the main amplifying unit 4 comprises the 90-degree hybrid 13, the amplifying units 14A and 14B and the 90-degree hybrid 15. The functions of the main amplifying unit 4 and the subsidiary amplifying unit 5 are the same as those in the first embodiment. In detail, each of the amplifying units 14A and 14B of the main amplifying unit 4 functions as an amplifier in which an amplifying operation is performed regardless of a value of the instantaneous electric power of the high-frequency signal, and each of the amplifying units 14A and 14B functions as an amplifier biased in a so-called class-A, class-AB or class-B. Also, the subsidiary amplifying unit 5 functions as an amplifier, for example, biased in a class-C, an amplifying operation is performed in the subsidiary amplifying unit 5 in a case where the instantaneous electric power of the high-frequency signal is heightened due to a change of an envelope of the high-frequency signal modulated, and an amplified high-frequency signal is output. An output terminal of the subsidiary amplifying unit 5 is connected to an isolation terminal of the 90-degree hybrid 15 composing the main amplifying unit 4.

Next, an operation will be described below.

In a case where the instantaneous electric power of the high-frequency signal input is low, only the main amplifying unit 4 is operated. Therefore, the high-frequency signal of one line distributed from the divider 3 is distributed to two lines in the 90-degree hybrid 13, two high-frequency signals of the two lines are amplified in the amplifying units 14A and 14B respectively, two amplified high-frequency signals having two output electric powers output from the amplifying units 14A and 14B flow as shown by arrows of solid lines in FIG. 7 and are combined with each other in the 90-degree hybrid 15, and the combined high-frequency signal having the combined output electric power is output through the output terminal 2. In this case, no output appears at the isolation terminal of the 90-degree hybrid 15. The load impedance seen from the main amplifying unit 4 indicates an impedance (for example, 50Ω) in the connection to the output terminal 2, and a matching circuit arranged in the high-frequency amplifier is adjusted so as to improve the efficiency.

In contrast, in a case where the instantaneous electric power of the high-frequency signal input is high, the main amplifying unit 4 and the subsidiary amplifying unit 5 are operated. Therefore, the high-frequency signal of the other line distributed from the divider 3 is amplified in the subsidiary amplifying unit 5. An amplified high-frequency signal having an output electric power output from the subsidiary amplifying unit 5 flows and is distributed to two lines in the 90-degree hybrid 15 as shown by arrows of dotted lines in FIG. 7, and two output electric powers of two amplified high-frequency signals of the two lines are injected into the output sides of the amplifying units 14A and 14B respectively.

For the same reason as that in the first embodiment, apparent load impedances of the amplifying units 14A and 14B of the main amplifying unit 4 are changed according to the high-frequency signal injected from the subsidiary amplifying unit 5 to load impedances corresponding to a high saturation electric power. Therefore, even though a high-frequency signal having the high instantaneous electric power is input to the high-frequency amplifier, the high-frequency signal can be amplified. Accordingly, the input high-frequency signal having the high instantaneous electric power is amplified in the amplifying units 14A and 14B without cutting off a great portion of the instantaneous electric power of the input high-frequency signal, the amplified high-frequency signals output from the amplifying units 14A and 14B are combined with each other in the 90-degree hybrid 15, and the combined high-frequency signal is output through the output terminal 2.

In the same manner as in the first embodiment, in the high-frequency amplifier having the main amplifying unit 4 and the subsidiary amplifying unit 5 according to the second embodiment, the efficiency can be heightened in a low power output operation regardless of the high saturation electric power of the high-frequency amplifier set in a high power output operation.

In general, in cases where a high electric power type high-frequency amplifier is produced, the configuration of the main amplifying unit 4 so-called the configuration of a balance amplifier is often used as an electric power combining means for combining electric powers of the amplifying units 14A and 14B with each other. Because the high-frequency signal output from the subsidiary amplifying unit 5 is input to each of the amplifying units 14A and 14B through the isolation terminal of the 90-degree hybrid 15 disposed on the output side, it is not required to use the circulator 6 used in the first embodiment, but the same effect as that in the first embodiment can be obtained. In addition, an effect of improving the efficiency due to the reduction of loss and an effect of producing the high-frequency amplifier at low cost can be obtained.

Here, the 90-degree hybrid 13 disposed on the input side is arranged to compensate for a phase difference of 90 degrees occurring in the 90-degree hybrid 15 disposed on the output side. Therefore, it is applicable that the high-frequency signal be distributed to two lines in a distributing means and a phase difference of 90 degrees in two high-frequency signals of the two lines is set in a delaying means.

As is described above, in the second embodiment, the high-frequency amplifier comprises the divider 3 for distributing a high-frequency signal input to the input terminal 1 to two lines of two output sides, the 90-degree hybrid 13, connected to one output side of the divider 3, for distributing the high-frequency signal of one line output from the divider 3 to two lines, the amplifying units 14A and 14B for amplifying two high-frequency signals of the two lines output from the 90-degree hybrid 13 respectively, the subsidiary amplifying unit 5, connected to the other output side of the divider 3, for performing no operation in a case where the instantaneous electric power of the high-frequency signal input to the subsidiary amplifying unit 5 is low and amplifying the high-frequency signal of the other line output from the divider 3 in a case where the instantaneous electric power of the high-frequency signal input to the input terminal 1 is high, and the 90-degree hybrid 15 for injecting the high-frequency signal amplified in the subsidiary amplifying unit 5 into the output sides of the amplifying units 14A and 14B, combining the high-frequency signals amplified in the amplifying units 14A and 14B with each other and outputting the combined high-frequency signal to the output terminal 2. Accordingly, in addition to the same effect as that in the first embodiment, loss in the high-frequency signal is reduced to a degree corresponding to no requirement of the circulator 6 of the first embodiment, the efficiency in the high-frequency amplifier can be improved, and a production cost of the high-frequency amplifier can be reduced.

Embodiment 3

Figure 8:
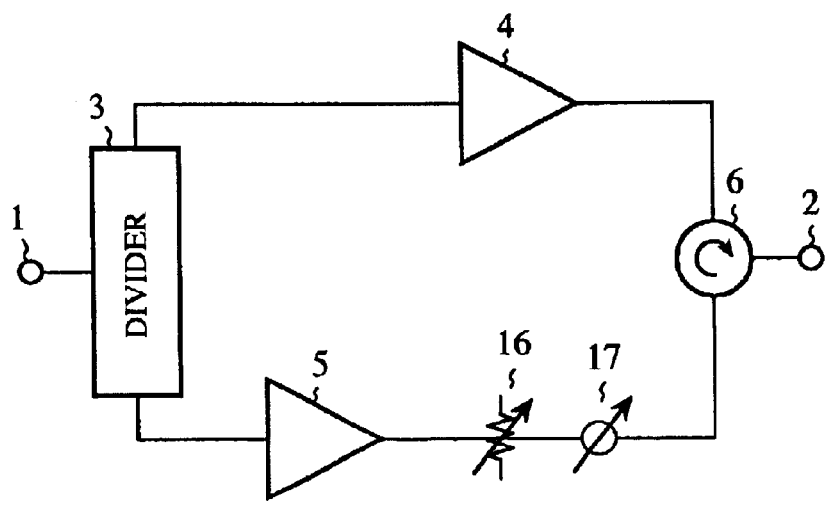
FIG. 8 is a view showing the configuration of a high-frequency amplifier according to a third embodiment of the present invention.

FIG. 8 is a view showing the configuration of a high-frequency amplifier according to a third embodiment of the present invention. The constituent elements, which are the same as those shown in FIG. 5, are indicated by the same reference numerals as those of the constituent elements shown in FIG. 5.

In FIG. 8, 16 indicates a variable attenuation unit (or first amplitude and phase adjusting means) in which an amplitude of the high-frequency signal passing the subsidiary amplifying unit 5 is adjusted. 17 indicates a variable phase shift unit (or first amplitude and phase adjusting means) in which a phase of the high-frequency signal passing the subsidiary amplifying unit 5 is adjusted. In the third embodiment, the variable attenuation unit 16 and the variable phase shift unit 17 are arranged between the subsidiary amplifying unit 5 and the circulator 6, and both an amplitude and a phase of the high-frequency signal output from the subsidiary amplifying unit 5 are adjusted.

Therefore, both an amplitude and a phase of the high-frequency signal injected into the main amplifying unit 4 through the circulator 6 can be optimized, an apparent load impedance of the main amplifying unit 4 in case of the high instantaneous electric power can be adjusted, and the efficiency in the high-frequency amplifier can be further improved.

Embodiment 4

Figure 9:
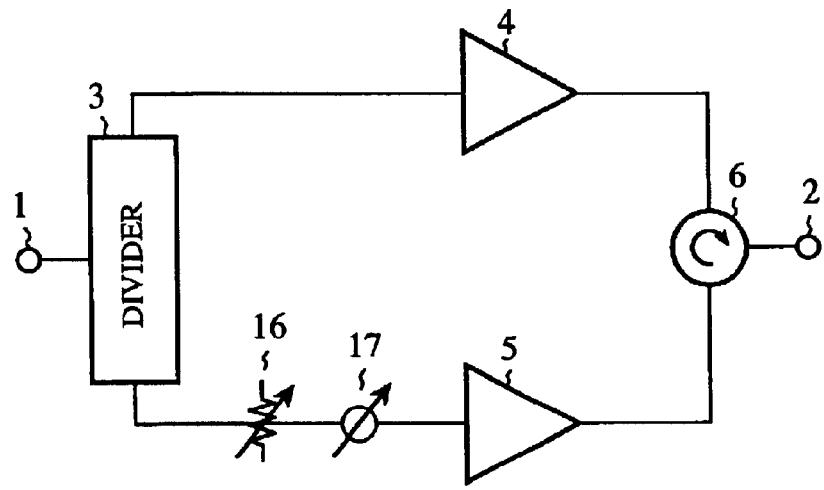
FIG. 9 is a view showing the configuration of a high-frequency amplifier according to a fourth embodiment of the present invention.

In a fourth embodiment, another high-frequency amplifier using the variable attenuation unit 16 and the variable phase shift unit 17 will be described FIG. 9 is a view showing the configuration of a high-frequency amplifier according to the fourth embodiment of the present invention. The constituent elements, which are the same as those shown in FIG. 8, are indicated by the same reference numerals as those of the constituent elements shown in FIG. 8.

In FIG. 9, the variable attenuation unit 16 and the variable phase shift unit 17 are arranged between the divider 3 and the subsidiary amplifying unit 5, both an amplitude and a phase of the high-frequency signal output from the divider 3 are adjusted in the variable attenuation unit 16 and the variable phase shift unit 17 respectively, and the adjusted high-frequency signal is amplified in the subsidiary amplifying unit 5. Therefore, there is no influence of loss occurring in the variable attenuation unit 16 and the variable phase shift unit 17 on the high-frequency signal output from the subsidiary amplifying unit 5. Accordingly, in addition to the same effect as that in the third embodiment, the efficiency in the high-frequency amplifier can be further improved as compared with that in the third embodiment.

Also, it is applicable that the variable attenuation unit 16 and the variable phase shift unit 17 be arranged in the high-frequency amplifier described in the second embodiment.

Figure 10:
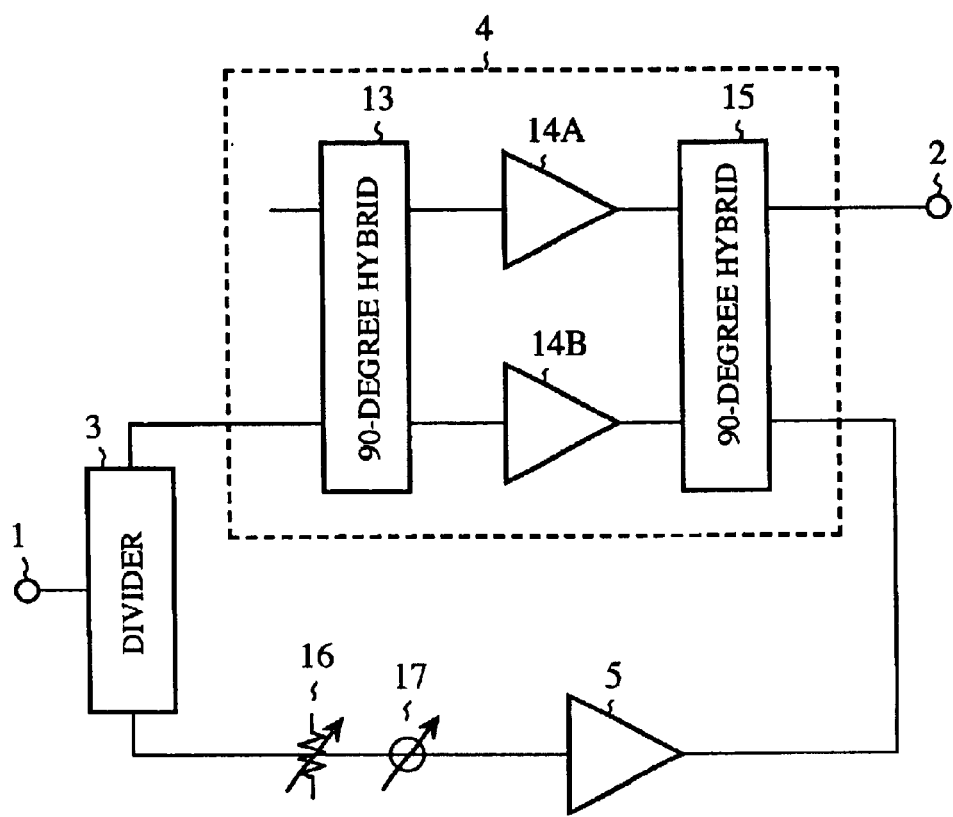
FIG. 10 is a view showing the configuration of a high-frequency amplifier according to the fourth embodiment of the present invention.

FIG. 10 is a view showing the configuration of another high-frequency amplifier according to the fourth embodiment of the present invention. The constituent elements, which are the same as those shown in FIG. 7 or FIG. 8, are indicated by the same reference numerals as those of the constituent elements shown in FIG. 7 or FIG. 8.

In FIG. 10, the variable attenuation unit 16 and the variable phase shift unit 17 are arranged between the divider 3 and the subsidiary amplifying unit 5 shown in FIG. 7. In this case, the same effect as that obtained in the high-frequency amplifier shown in FIG. 9 can be obtained.

Also, it is applicable that the variable attenuation unit 16 and the variable phase shift unit 17 be arranged between the subsidiary amplifying unit 5 and the 90-degree hybrid 15. In this case, the same effect as that in the third embodiment can be obtained.

Embodiment 5

Figure 11:
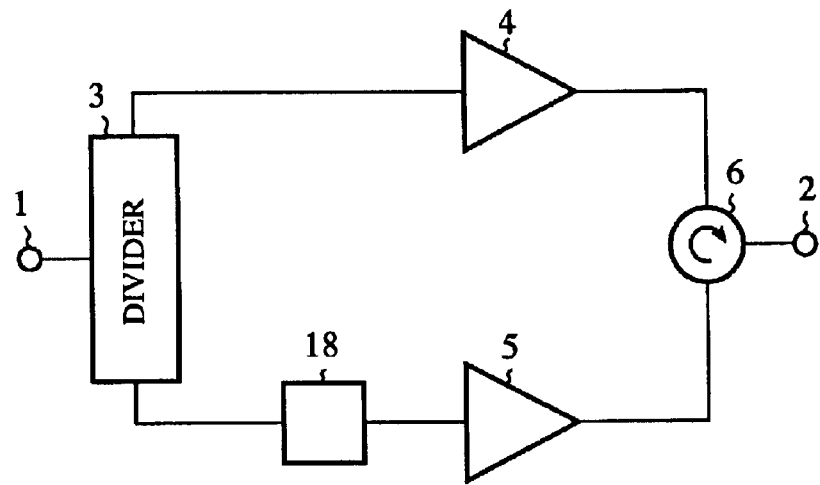
FIG. 11 is a view showing the configuration of a high-frequency amplifier according to a fifth embodiment of the present invention.

FIG. 11 is a view showing the configuration of a high-frequency amplifier according to a fifth embodiment of the present invention. The constituent elements, which are the same as those shown in FIG. 5, are indicated by the same reference numerals as those of the constituent elements shown in FIG. 5.

In FIG. 11, 18 indicates a delay circuit (or delaying means) in which the high-frequency signal planned to pass through the subsidiary amplifying unit 5 is delayed by a delay time. As shown in FIG. 11, the delay circuit 18 is arranged between the divider 3 and the subsidiary amplifying unit 5. The delay circuit 18 functions so as to make a delay time occurring in the high-frequency signal on a line of the side of the main amplifying unit 4 agree with a delay time occurring in the high-frequency signal on a line of the side of the subsidiary amplifying unit 5. Accordingly, the effect due to the injection of the high-frequency signal output from the subsidiary amplifying unit 5 into the main amplifying unit 4 can be obtained over the wide frequency band.

In this embodiment, it is preferred that the delay circuit 18 is formed of a generally-used line such as a coaxial line or is formed of a delay filter using a delay characteristic of a band pass filter.

Also, it is applicable that the delay circuit 18 be arranged between the subsidiary amplifying unit 5 and the circulator 6. Also, it is applicable that the delay circuit 18 be arranged between the divider 3 and the main amplifying unit 4 or between the main amplifying unit 4 and the circulator 6 while considering a difference between the delay time occurring in the main amplifying unit 4 and the delay time occurring in the subsidiary amplifying unit 5.

Also, it is applicable that the delay circuit 18 be arranged in the high-frequency amplifier described in the second embodiment. In detail, in FIG. 7, the delay circuit 18 is arranged between the divider 3 and the subsidiary amplifying unit 5, between the subsidiary amplifying unit 5 and the 90-degree hybrid 15, between the divider 3 and the main amplifying unit 4 or between the group of amplifying units 14A and 14B and the 90-degree hybrid 13, and the same effect as that in the fifth embodiment can be obtained.

Also, it is applicable that a frequency equalizer be arranged in place of the delay circuit 18 so as to make a frequency characteristic of the high-frequency signal passing the main amplifying unit 4 agree with a frequency characteristic of the high-frequency signal passing the subsidiary amplifying unit 5. The frequency equalizer is arranged in the same position as that of the delay circuit 18. Therefore, the wide frequency band effect can be obtained in the same manner. Also, it is applicable that the frequency equalizer be arranged in addition to the delay circuit 18.

Embodiment 6

Figure 12:
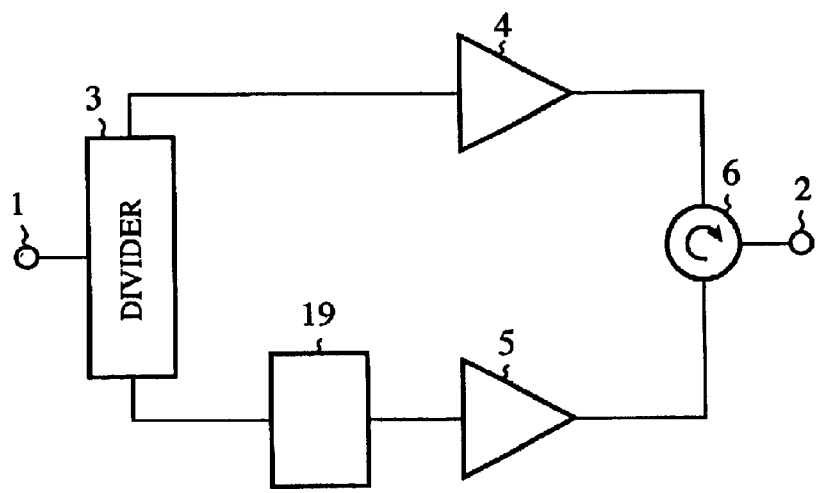
FIG. 12 is a view showing the configuration of a high-frequency amplifier according to a sixth embodiment of the present invention.

FIG. 12 is a view showing the configuration of a high-frequency amplifier according to a sixth embodiment of the present invention. The constituent elements, which are the same as those shown in FIG. 5, are indicated by the same reference numerals as those of the constituent elements shown in FIG. 5.

In FIG. 12, 19 indicates an AM-AM/PM adjusting unit (or AM-AM/PM adjusting means) in which a passing phase characteristic and a change of an instantaneous electric power (called an instantaneous output electric power) of a high-frequency signal output from the subsidiary amplifying unit 5 are adjusted according to a change of an instantaneous electric power (called an instantaneous input electric power) of a high-frequency signal input to the subsidiary amplifying unit 5. In the sixth embodiment, the AM-AM/PM adjusting unit 19 is arranged between the divider 3 and the subsidiary amplifying unit 5.

An electric power is output from the subsidiary amplifying unit 5 only in a case where an instantaneous electric power of the high-frequency signal input to the subsidiary amplifying unit 5 is equal to or higher than a prescribed value. To heighten the efficiency in the whole high-frequency amplifier, it is required to optimize both a value of the instantaneous input electric power, at which the amplifying operation of the subsidiary amplifying unit 5 is started, and a change of the instantaneous output electric power with respect to the input instantaneous electric power. In other words, it is required to optimize a change of an output electric power (so-called AM—AM characteristic) with respect to a change of an input electric power in the subsidiary amplifying unit 5.

Also, in cases where a passing phase characteristic (so-called AM–PM characteristic) of the subsidiary amplifying unit 5 is changed due to a change of the instantaneous input electric power, a phase of the high-frequency signal injected into the output side of the main amplifying unit 4 through the circulator 4 is changed, and an apparent load impedance seen from the main amplifying unit 4 is shifted from a value corresponding to a desired state.

To compensate for the above-described phenomenon and perform an optimum operation, the AM-AM/PM adjusting unit 19 is arranged in the high-frequency amplifier.

The AM-AM/PM adjusting unit 19 can be generally formed of a non-linear circuit.

Figure 13:
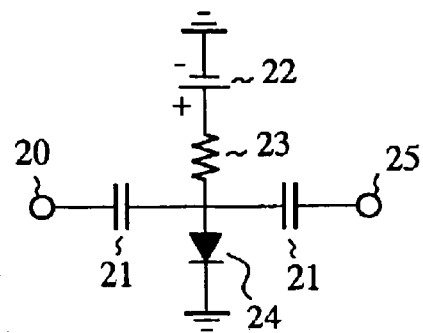
FIG. 13 is a view showing an example of the configuration of an AM-AM/PM adjusting unit.

FIG. 13 is a view showing an example of the configuration of the AM-AM/PM adjusting unit 19.

In FIG. 13, 20 indicates an input terminal (or an AM-AM/PM adjusting unit input terminal). 21 indicates each of two condensers for direct-current cut. 22 indicates a direct-current bias power source. 23 indicates a bias resistor. 24 indicates a diode. 25 indicates an output terminal (or an AM-AM/PM adjusting unit output terminal).

The AM-AM/PM adjusting unit 19 shown in FIG. 13 comprises the two condensers 21 serially connected to each other between the input terminal 20 and the output terminal 25, the diode 24 arranged between a connection point of the condensers 21 and the ground, and the direct-current bias power source 22 for supplying a direct-current bias to the connection point of the condensers 21 through the bias resistor 23.

The AM-AM/PM adjusting unit 19 shown in FIG. 13 is an example of a non-linear circuit using a diode which is disclosed in a literature "Transaction on Microwave Theory and Techniques", IEEE, vol. 45, No. 12, p. 2431, December, 1997. The AM-AM/PM adjusting unit 19 is generally used as a linearizer which compensates for the non-linearity (or distortion) of an amplifier. Because the AM-AM/PM adjusting unit 19 is arranged in the high-frequency amplifier, an effect of compensating for the non-linearity of the subsidiary amplifying unit 5 can be obtained by adding a simple structure.

The sixth embodiment is not limited to the AM-AM/PM adjusting unit 19 shown in FIG. 13. For example, it is applicable that the AM-AM/PM adjusting unit 19 be formed of a circuit generally having a non-linear characteristic in which circuit constants are changed to desired values.

Figure 14:
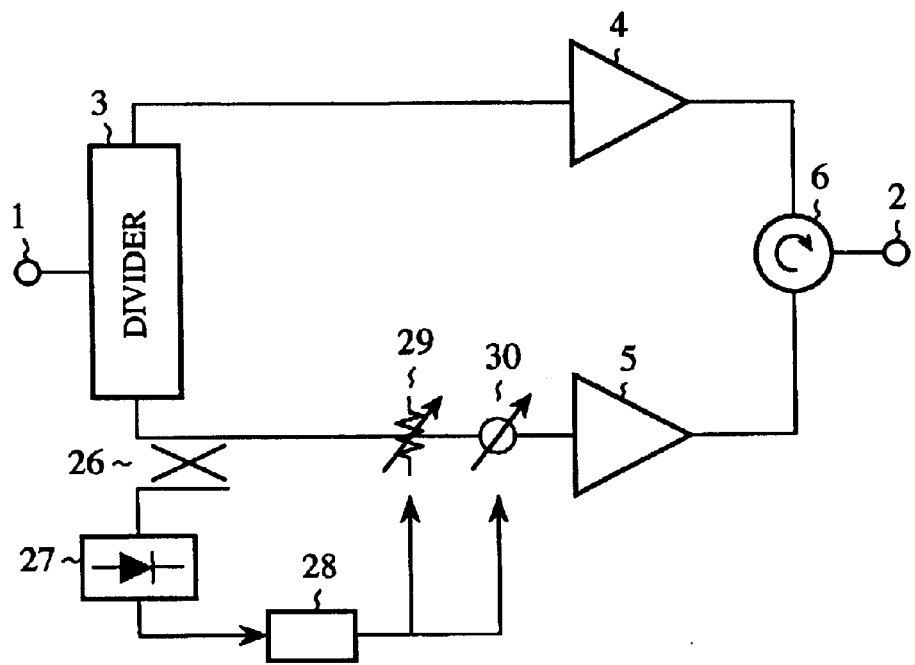
FIG. 14 is a view showing the configuration of a high-frequency amplifier having the AM-AM/PM adjusting unit.

FIG. 14 is a view showing the configuration of a high-frequency amplifier having an AM-AM/PM adjusting unit 19 of which the configuration differs from that shown in FIG. 13. The constituent elements, which are the same as those shown in FIG. 5, are indicated by the same reference numerals as those of the constituent elements shown in FIG. 5.

In FIG. 14, 26 indicates a divider (or third distributing means) in which a portion of the high-frequency signal distributed by the divider 3 is taken out. 27 indicates a level detecting unit (or first amplitude detecting means) in which a level of an instantaneous electric power of the high-frequency signal distributed by the divider 26 is detected. 28 indicates a control unit (or control means) in which a variable attenuation unit 29 (or second amplitude and phase adjusting means) and a variable phase shift unit 30 (or second amplitude and phase adjusting means) are controlled according to the level of the instantaneous electric power detected in the level detecting unit 27.

The variable attenuation unit 29 and the variable phase shift unit 30 are adjusted by the control unit 28 according to the level of the instantaneous electric power detected in the level detecting unit 27 so as to set a degree of attenuation and a degree of phase shift stored in advance in the control unit 28 in the variable attenuation unit 29 and the variable phase shift unit 30. Therefore, the divider 26, the level detecting unit 27 and the control unit 28 can be used as the AM-AM/PM adjusting unit 19.

Figure 15:
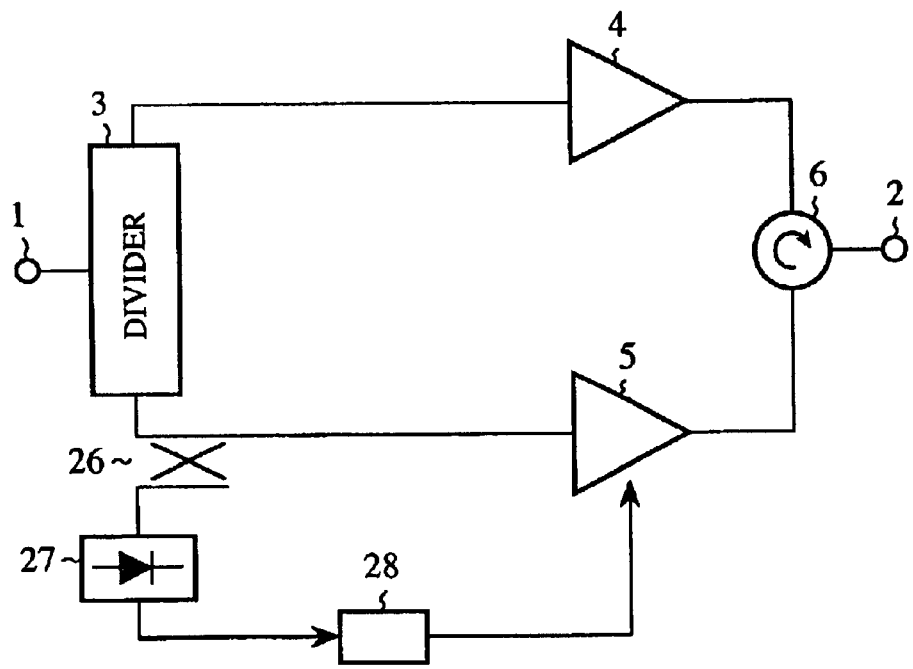
FIG. 15 is a view showing the configuration of another high-frequency amplifier having the AM-AM/PM adjusting unit.

FIG. 15 is a view showing the configuration of a high-frequency amplifier having an AM-AM/PM adjusting unit 19 of which the configuration differs from those shown in FIG. 13 and FIG. 14. The constituent elements, which are the same as those shown in FIG. 14, are indicated by the same reference numerals as those of the constituent elements shown in FIG. 14.

In the control unit 28 shown in FIG. 15, a bias condition of the subsidiary amplifying unit 5 is changed according to the level of the instantaneous electric power detected in the level detecting unit 27 in cooperation with the divider 26. Because a gain and a passing phase in the subsidiary amplifying unit 5 are changed according to the bias condition, in cases where the bias condition of the subsidiary amplifying unit 5 is changed according to the level of the instantaneous electric power input to the subsidiary amplifying unit 5, a desired AM-AM/PM characteristic can be obtained in the subsidiary amplifying unit 5. Therefore, the subsidiary amplifying unit 5 is used as a second amplitude and phase adjusting means of the high-frequency signal by changing the bias condition.

As is described above, the AM-AM/PM adjusting unit 19 is arranged in the high-frequency amplifier. Therefore, a level of the electric power, at which the amplifying operation of the subsidiary amplifying unit 5 is started, and a value of an output electric power corresponding to an input electric power can be optimized, the high-frequency signal injected into the main amplifying unit 4 are optimized, and the efficiency in the whole high-frequency amplifier can be improved.

Also, it is preferred that the AM-AM/PM adjusting unit 19 be arranged in the high-frequency amplifier described in the second embodiment, and the same effect as that in the sixth embodiment can be obtained.

Embodiment 7

Figure 16:
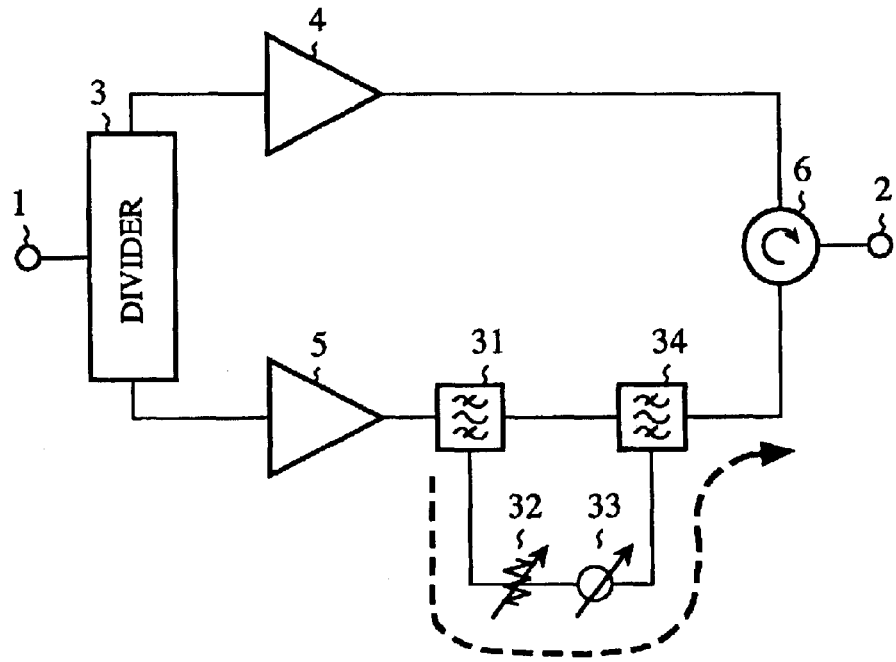
FIG. 16 is a view showing the configuration of a high-frequency amplifier according to a seventh embodiment of the present invention.

FIG. 16 is a view showing the configuration of a high-frequency amplifier according to a seventh embodiment of the present invention. The constituent elements, which are the same as those shown in FIG. 5, are indicated by the same reference numerals as those of the constituent elements shown in FIG. 5.

In FIG. 16, 31 indicates a diplexer (or demultiplexing means) in which a group of harmonic wave components such as a second-harmonic wave of the high-frequency signal output from the subsidiary amplifying unit 5 and a fundamental wave component of the high-frequency signal are demultiplexed from each other. 32 indicates a variable attenuation unit (or third amplitude and phase adjusting means) in which amplitudes of the harmonic wave components demultiplexed in the diplexer 31 are adjusted. 33 indicates a variable phase shift unit (or third amplitude and phase adjusting means) in which phases of the harmonic wave components demultiplexed in the diplexer 31 are adjusted. 34 indicates a diplexer (or multiplexing means) in which the harmonic wave components passing the variable phase shift unit 33 is multiplexed with the fundamental wave component demultiplexed in the diplexer 31 to output the fundamental wave component and the harmonic wave components multiplexed with each other to the circulator 6.

As is well-known, the efficiency and distortion characteristic in a high-frequency amplifier can be improved by optimizing a load impedance for harmonic wave components of a high-frequency signal such as a second-harmonic wave in an output circuit. Also, in general, a large amount of harmonic wave components of a high-frequency signal are output from a class-C amplifier or a class-B amplifier used as the subsidiary amplifying unit 5 due to the non-linear characteristic of the class-C amplifier or the class-B amplifier.

Therefore, in cases where amplitudes and phases of harmonic wave components of the high-frequency signal output from the subsidiary amplifying unit 5 are adjusted and injected into the output side of the main amplifying unit 4 in the same manner as the fundamental wave component of the high-frequency signal, a load impedance of the main amplifying unit 4 for the harmonic wave components of a high-frequency signal can be changed, and the efficiency in the main amplifying unit 4 can be further improved.

The fundamental wave component and the harmonic wave components generated in the subsidiary amplifying unit 5 are demultiplexed from each other in the diplexer 31. The fundamental wave component of the high-frequency signal is input to the diplexer 34, amplitudes and phases of the harmonic wave components of the high-frequency signal are adjusted in the variable attenuation unit 32 and the variable phase shift unit 33, the fundamental wave component and the adjusted harmonic wave components are multiplexed with each other in the diplexer 34 (an arrow of a dotted line in FIG. 16), and the multiplexed wave of the high-frequency signal is injected into the output side of the main amplifying unit 4 through the circulator 6. In this case, the variable attenuation unit 32 and the variable phase shift unit 33 are adjusted so as to obtain optimum conditions (or optimum phase and amplitude conditions) of the harmonic wave components injected into the output side of the main amplifying unit 4.

Because the amplitudes and phases of the harmonic wave components of the high-frequency signal output from the subsidiary amplifying unit 5 are optimized and injected into the output side of the main amplifying unit 4, the efficiency in the whole high-frequency amplifier can be further improved.

Here, it is applicable that the diplexer 31, the variable attenuation unit 32 and the variable phase shift unit 33 and the diplexer 34 be arranged in the high-frequency amplifier of the second embodiment, and the same effect as that in the seventh embodiment can be obtained.

Embodiment 8

It is preferred that the diplexer 34 described in the seventh embodiment is arranged on the output side of the main amplifying unit 4 shown in FIG. 5.

Figure 17:
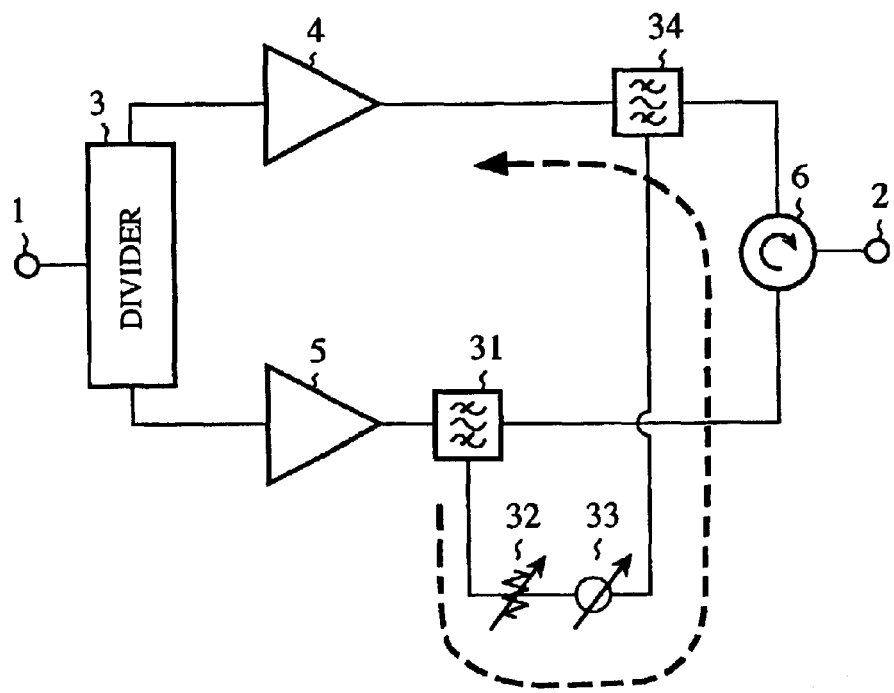
FIG. 17 is a view showing the configuration of a high-frequency amplifier according to an eighth embodiment of the present invention.

FIG. 17 is a view showing the configuration of a high-frequency amplifier according to an eighth embodiment of the present invention. The constituent elements, which are the same as those shown in FIG. 5 or FIG. 16, are indicated by the same reference numerals as those of the constituent elements shown in FIG. 5 or FIG. 16.

In FIG. 17, the diplexer 34 is arranged between the circulator 6 and the main amplifying unit 4. Therefore, the fundamental wave component demultiplexed in the diplexer 31 is input to the diplexer 34 through the circulator 6, the fundamental wave component is multiplexed in the diplexer 34 with the harmonic wave components passing the variable attenuation unit 32 and the variable phase shift unit 33, and the fundamental wave component and the harmonic wave components multiplexed with each other are injected into the output side of the main amplifying unit 4.

Therefore, the same effect as that in the seventh embodiment can be obtained. Also, as compared with the seventh embodiment, because only the fundamental wave component passes through the circulator 6, the circulator 6 of a narrow frequency band matching with the fundamental wave component can be used, loss in the circulator 6 can be reduced, and a small-sized circulator 6 can be obtained at low cost. Also, the efficiency in the high-frequency amplifier can be improved, and the high-frequency amplifier can be obtained at low cost.

Embodiment 9

Figure 18:
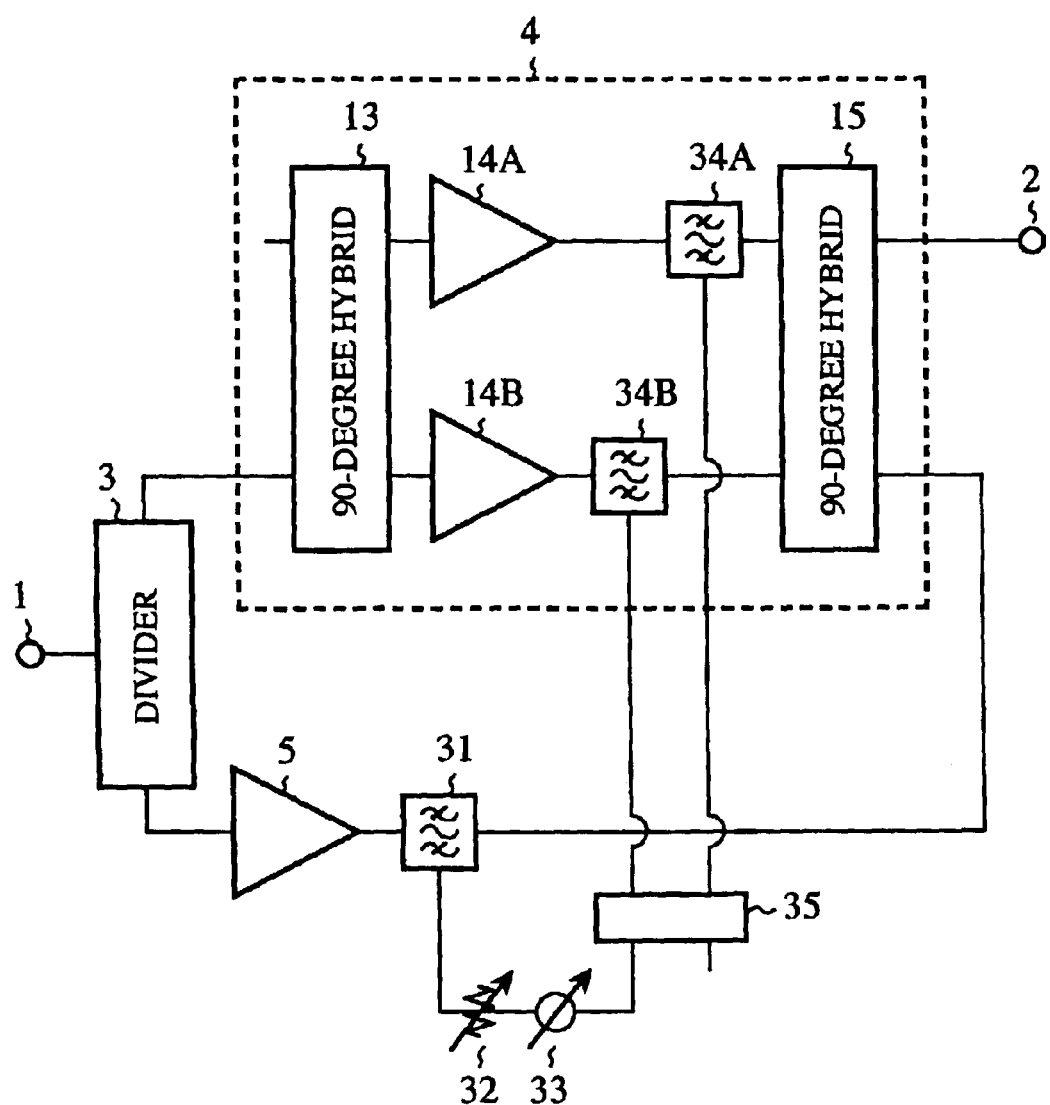
FIG. 18 is a view showing the configuration of a high-frequency amplifier according to a ninth embodiment of the present invention.

FIG. 18 is a view showing the configuration of a high-frequency amplifier according to a ninth embodiment of the present invention. The constituent elements, which are the same as those shown in FIG. 7 or FIG. 16, are indicated by the same reference numerals as those of the constituent elements shown in FIG. 7 or FIG. 16.

In FIG. 18, 35 indicates a 90-degree hybrid (or a second 90-degree hybrid) in which a group of harmonic wave components and another group of harmonic wave components having a phase difference of 90 degrees from each other are produced from the harmonic wave components passing the variable attenuation unit 32 and the variable phase shift unit 33. 34A indicates a diplexer (or first multiplexing means) arranged between the amplifying unit 14A and the 90-degree hybrid 15, and 34AB indicates a diplexer (or second multiplexing means) arranged between the amplifying unit 14B and the 90-degree hybrid 15. The fundamental wave component and one group of harmonic wave components are multiplexed with each other in each of the diplexers 34A and 34B.

Because the operations of the amplifying units 14A and 14B composing the main amplifying unit 4 are performed at the phase difference of 90 degrees set by the 90-degree hybrid 13, it is required that two groups of harmonic wave components injected into the amplifying units 14A and 14B respectively have the phase difference of 90 degrees from each other. In the ninth embodiment, two groups of harmonic wave components having the phase difference of 90 degrees from each other are produced from the harmonic wave components in the 90-degree hybrid 35, the fundamental wave component passing the 90-degree hybrid 15 and one group of harmonic wave components passing the 90-degree hybrid 35 are multiplexed with each other in each of the diplexers 34A and 34B, and the fundamental wave component and one group of harmonic wave components multiplexed with each other are injected into each of the amplifying units 14A and 14B.

Accordingly, the same effect as that in the eighth embodiment can be obtained. Also, because it is not required to use the circulator 6 used in the eighth embodiment, loss in the high-frequency amplifier can be reduced, and the efficiency in the high-frequency amplifier can be improved.

Embodiment 10

Figure 19:
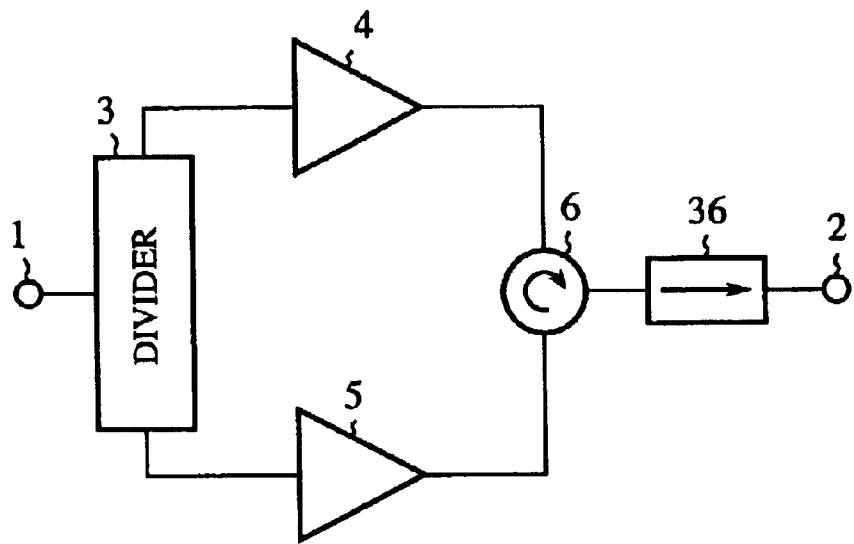
FIG. 19 is a view showing the configuration of a high-frequency amplifier according to a tenth embodiment of the present invention.

FIG. 19 is a view showing the configuration of a high-frequency amplifier according to a tenth embodiment of the present invention. The constituent elements, which are the same as those shown in FIG. 5, are indicated by the same reference numerals as those of the constituent elements shown in FIG. 5.

In FIG. 19, 36 indicates an isolator arranged between the circulator 6 and the output terminal 2. A high-frequency signal passes through the isolator 36 so as to send the high-frequency signal from the circulator 6 to the output terminal 2.

In cases where the output terminal 2 is directly connected to an antenna, there is a case where a high-frequency signal reflected by the antenna is returned according to environments around the antenna.

In this case, the reflected wave is not sent to the output side of the main amplifying unit 4 by the function of the circulator 6. However, because the reflected wave sent from the output terminal 2 is added to the output side of the subsidiary amplifying unit 5 through the circulator 6, the reflected wave is isolated from the high-frequency amplifier by arranging the isolator 36. Accordingly, changes of characteristics of the subsidiary amplifying unit 5 due to the reflected wave can be prevented, and a high-frequency amplifier stably operated at high efficiency can be obtained.

Also, in cases where the isolator 36 is arranged between the 90-degree hybrid 15 and the output terminal 2 in the high-frequency amplifier of the second embodiment, the same effect as that in the tenth embodiment can be obtained.

Embodiment 11

It is applicable that the isolator 36 described in the tenth embodiment be arranged between the subsidiary amplifying unit 5 and the circulator 6.

Figure 20:
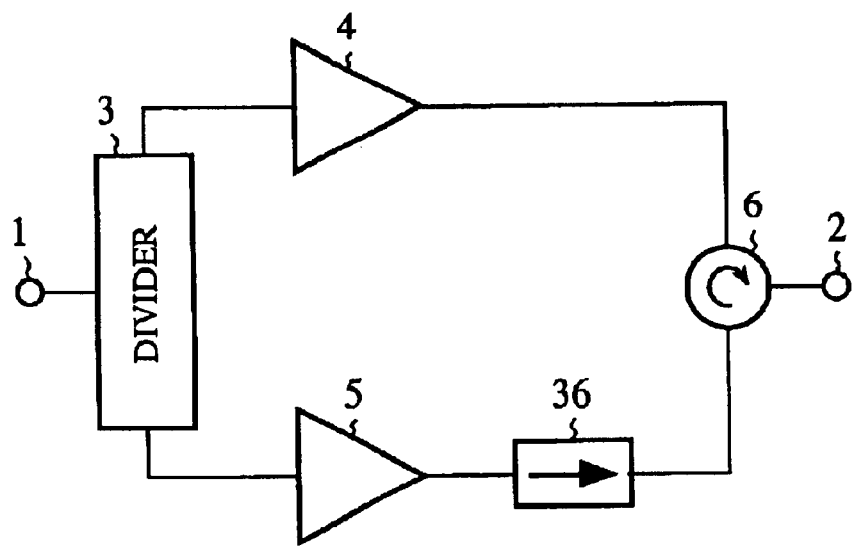
FIG. 20 is a view showing the configuration of a high-frequency amplifier according to an eleventh embodiment of the present invention.

FIG. 20 is a view showing the configuration of a high-frequency amplifier according to an eleventh embodiment of the present invention. The constituent elements, which are the same as those shown in FIG. 5 or FIG. 19, are indicated by the same reference numerals as those of the constituent elements shown in FIG. 5 or FIG. 19.

In FIG. 20, the isolator 36 is arranged between the subsidiary amplifying unit 5 and the circulator 6. The isolator 36 is arranged so as to send the high-frequency signal output from the subsidiary amplifying unit 5 to the circulator 6. Even though a reflected wave sent from an antenna (not shown) is input to the high-frequency amplifier through the output terminal 2, the reflected wave is not returned to the output side of the main amplifying unit 4 or the output side of the subsidiary amplifying unit 5. Accordingly, in the same manner as in the tenth embodiment, the degradation of characteristics of the main amplifying unit 4 and the subsidiary amplifying unit 5 due to the reflected wave can be prevented.

In addition to the same effect as that of the tenth embodiment, as compared with the tenth embodiment, because loss in the high-frequency signal output from the main amplifying unit 4 is caused only by the circulator 6, loss in the high-frequency signal output from the main amplifying unit 4 can be reduced by a degree of loss caused by the isolator 36. Accordingly, the efficiency in the high-frequency amplifier can be improved.

Embodiment 12

It is applicable that the isolator 36 described in the tenth and eleventh embodiments be arranged in the high-frequency amplifier of the second embodiment.

Figure 21:
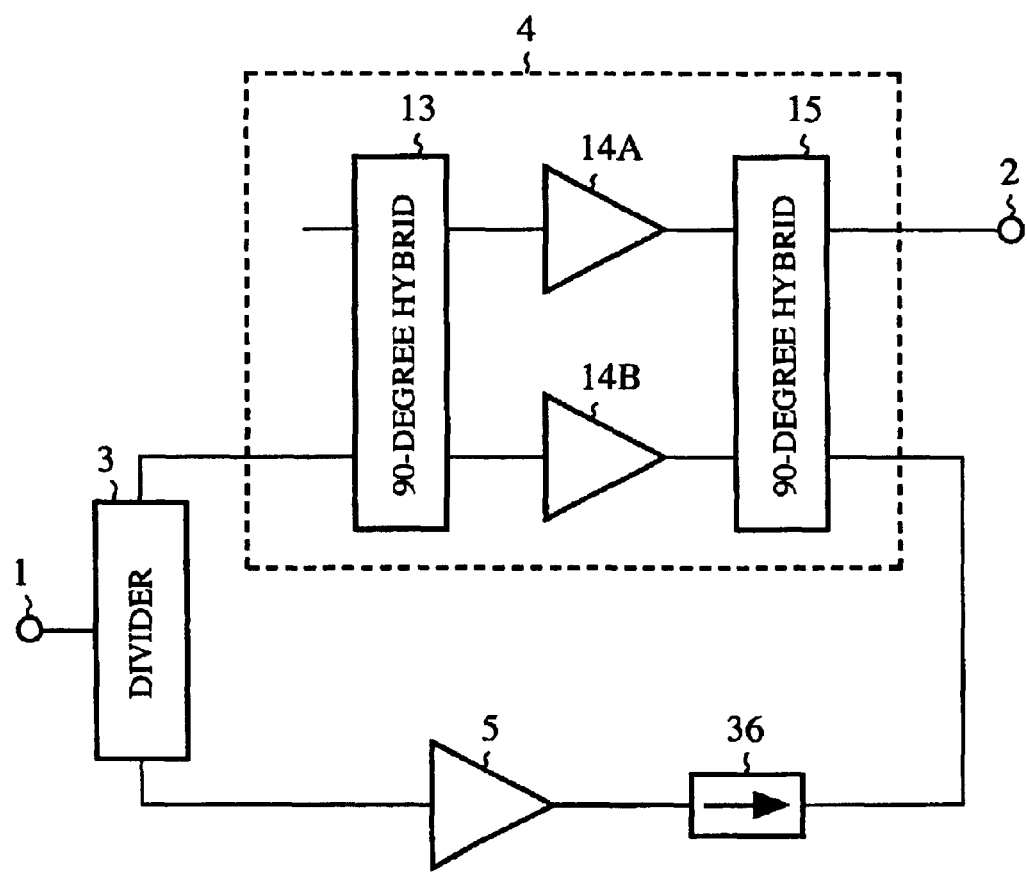
FIG. 21 is a view showing the configuration of a high-frequency amplifier according to a twelfth embodiment of the present invention.

FIG. 21 is a view showing the configuration of a high-frequency amplifier according to a twelfth embodiment of the present invention. The constituent elements, which are the same as those shown in FIG. 7 or FIG. 19, are indicated by the same reference numerals as those of the constituent elements shown in FIG. 7 or FIG. 19.

In FIG. 21, the isolator 36 is arranged between the subsidiary amplifying unit 5 and the 90-degree hybrid 15. The isolator 36 is arranged so as to send the high-frequency signal output from the subsidiary amplifying unit 5 to the isolation terminal of the 90-degree hybrid 15.

In cases where characteristics of the amplifying unit 14A of the main amplifying unit 4 perfectly agree with those of the amplifying unit 14B of the main amplifying unit 4, the output electric power sent from the amplifying units 14A and 14B is not supplied to the isolation terminal of the 90-degree hybrid 15. However, in cases where characteristics of the amplifying unit 14A of the main amplifying unit 4 differ from those of the amplifying unit 14B of the main amplifying unit 4, the output electric power sent from the amplifying units 14A and 14B is supplied to the isolation terminal of the 90-degree hybrid 15 and is undesirably injected into the output side of the subsidiary amplifying unit 5. Because of this phenomenon, characteristics of the subsidiary amplifying unit 5 are sometimes changed. Though the subsidiary amplifying unit 5 is not normally operated in case of a low instantaneous electric power of the high-frequency signal so as to flow no current through the subsidiary amplifying unit 5, if circumstances require, the subsidiary amplifying unit 5 is compulsorily operated due to the inflow of the electric power into the output side of the subsidiary amplifying unit 5, and there is a case where a current undesirably flows through the subsidiary amplifying unit 5.

Therefore, the isolator 36 is arranged between the subsidiary amplifying unit 5 and the 90-degree hybrid 15. In this case, even though characteristics of the amplifying unit 14A do not perfectly agree with those of the amplifying unit 14B, the inflow of the electric power into the output side of the subsidiary amplifying unit 5 can be prevented, and the isolator 36 can contribute to a stable operation of the high-frequency amplifier at high efficiency.

Embodiment 13

Figure 22:
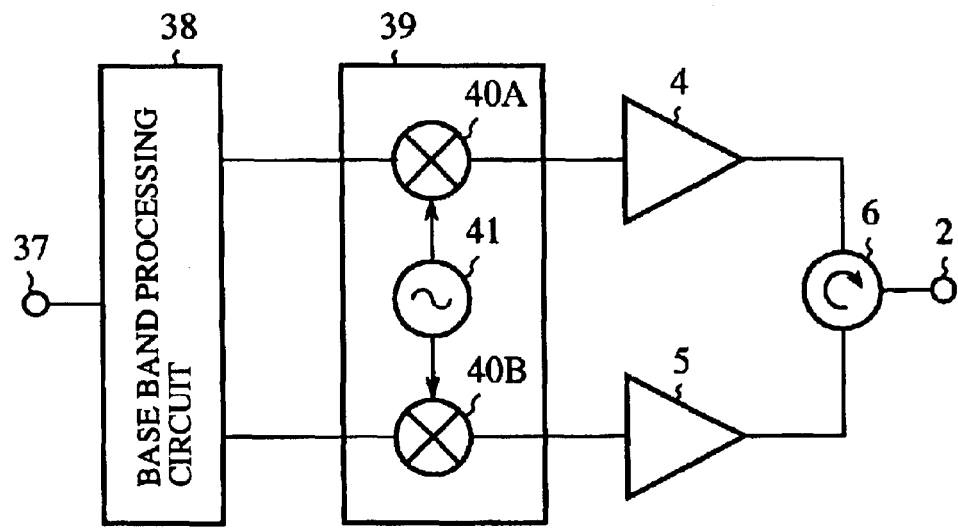
FIG. 22 is a view showing the configuration of a high-frequency amplifier according to a thirteenth embodiment of the present invention.

FIG. 22 is a view showing the configuration of a high-frequency amplifier according to a thirteenth embodiment of the present invention. The constituent elements, which are the same as those shown in FIG. 5, are indicated by the same reference numerals as those of the constituent elements shown in FIG. 5.

In FIG. 22, 37 indicates an input terminal to which a base band signal is input. 38 indicates a base band processing circuit (or base band processing means) in which a base band signal sent from the input terminal 37 is processed and distributed to two lines of two output sides. 39 indicates a frequency changing circuit (or first frequency changing means) in which the frequency-changing is performed for two base band signals of the two output sides sent from the base band processing circuit 38 to produce two high-frequency signals.

In the frequency changing circuit 39, 40A and 40B indicate two frequency changing mixers. 41 indicates a local oscillating unit. A local signal output from the local oscillating unit 41 and one base band signal output from the base band processing circuit 38 are mixed with each other in each of the frequency changing mixers 40A and 40B, and the local signal and the base band signal mixed with each other are output to each of the main amplifying unit 4 and the subsidiary amplifying unit 5.

In the first to twelfth embodiments, a signal input to the input terminal 1 is a high-frequency signal, the high-frequency signal is distributed to two lines of two output sides in the divider 3, and two high-frequency signals of the two output sides are input to the main amplifying unit 4 and the subsidiary amplifying unit 5 respectively. In contrast, in the thirteenth embodiment, a base band signal of a low frequency is distributed to two lines of two output sides in the base band processing circuit 38 of a communication unit. That is, the base band signal is distributed to a line including the main amplifying unit 4 and a line including the subsidiary amplifying unit 5.

A base band signal input to the input terminal 37 is distributed to two lines of two output sides in the base band processing circuit 38, and a frequency of two base band signals of the two lines is changed to a frequency of two high-frequency signals in the frequency changing circuit 39. In the same manner as in the first embodiment, these two high-frequency signals are amplified in the main amplifying unit 4 and the subsidiary amplifying unit 5 respectively, and two amplified high-frequency signals are output to the output terminal 2 through the circulator 6.

Because the base band signal is processed and distributed to two lines in the base band processing circuit 38 and because two base band signals of the two lines are converted into two high-frequency signals in the frequency changing circuit 39, the operation performed in the variable attenuation unit 16, the operation performed in the variable phase shift unit 17, the operation performed in the delay circuit 18, the operation performed in a frequency equalizer and the operation performed in the AM-AM/PM adjusting unit 19 described in the third to sixth embodiments can be performed in the base band processing circuit 38. Therefore, the above-described operations can be performed in a low frequency band in which the design of the frequency changing circuit 39 for the operations is easily. Accordingly, a degree of freedom in the circuit configuration of the high-frequency amplifier can be increased, and circuits easily adjusted and circuits corresponding to high precision can be arranged in the high-frequency amplifier.

Figure 23:
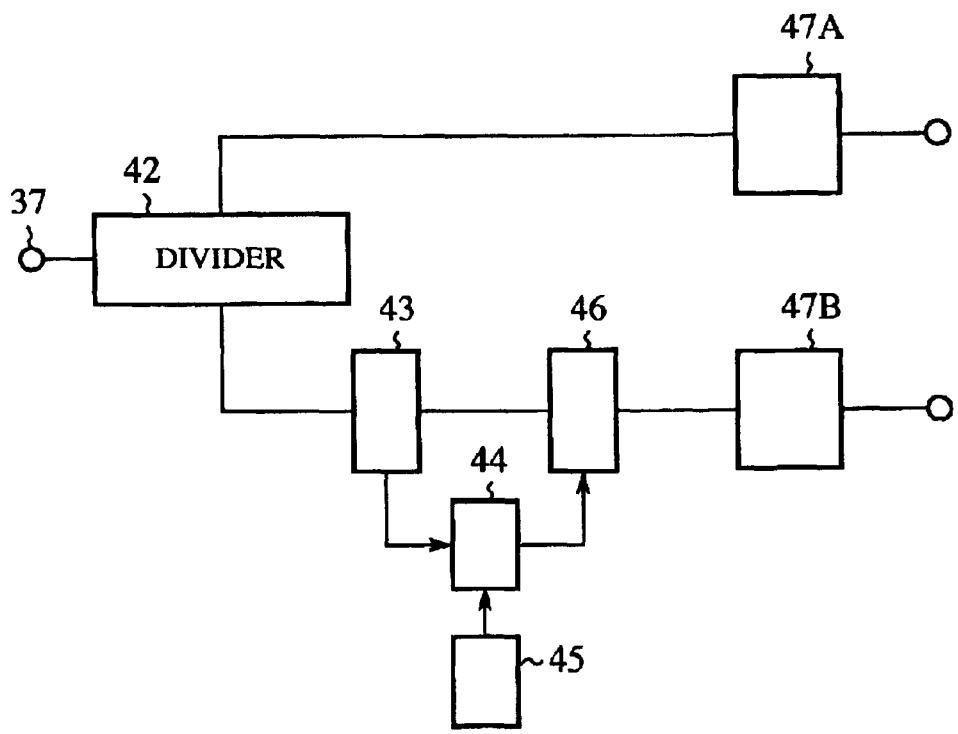
FIG. 23 is a view showing the configuration of an AM-AM/PM adjusting unit functioning as a base band processing circuit.

For example, FIG. 23 is a view showing the configuration of an AM-AM/PM adjusting unit functioning as the base band processing circuit 38. The constituent elements, which are the same as those shown in FIG. 22, are indicated by the same reference numerals as those of the constituent elements shown in FIG. 22.

In FIG. 23, 42 indicates a divider (or fourth distributing means) in which a base band signal input to the input terminal 37 is divided and distributed to two lines of two output sides. 43 indicates a level detecting unit (or second amplitude detecting means) in which a level of the base band signal of one line distributed by the divider 42 is detected. 44 indicates a control unit (or control means). 45 indicates a read only memory (ROM). 46 indicates a level and phase converting unit (or fourth amplitude and phase adjusting means) in which a level and a phase of the base band signal are adjusted. When a level value detected in the level detecting unit 43 is received in the control unit 44, the control unit 44 refers to data stored in advance in the ROM 45, and the control unit 44 controls the level and phase converting unit 46. Also, 47A and 47B indicate two digital-to-analog (D/A) converting units respectively. A digital signal output from the divider 42 is converted into an analog signal in the D/A converting unit 47A, and a digital signal output from the level and phase converting unit 46 is converted into an analog signal in the D/A converting unit 47B.

A base band signal input to the input terminal 37 is distributed to two lines of two output sides in the divider 42, the base band signal of one line distributed by the divider 42 is converted into an analog base band signal in the D/A converting unit 47A.

Also, a level of the base band signal of the other line distributed by the divider 42 is detected in the level detecting unit 43, the control unit 44 refers to a value of the detected level and data stored in the ROM 45, and the control unit 44 controls the level and phase converting unit 46 to adjust the level and phase of the other base band signal. Thereafter, the base band signal, of which the level and the phase are adjusted, is converted into an analog base band signal in the D/A converting unit 47B.

The base band signals output from the D/A converting units 47A and 47B respectively are converted into two high-frequency signals respectively in the frequency changing circuit 39 shown in FIG. 22.

As is described above, because the above-described operations are performed in the processing for the digital signal of the base band, as compared with the processing for the high-frequency signal, a degree of freedom in the adjustment is high, and the operations can be performed at higher precision. As a result, the processing for the digital signal of the base band can contribute to the heightening of the efficiency in the high-frequency amplifier.

Figure 24:
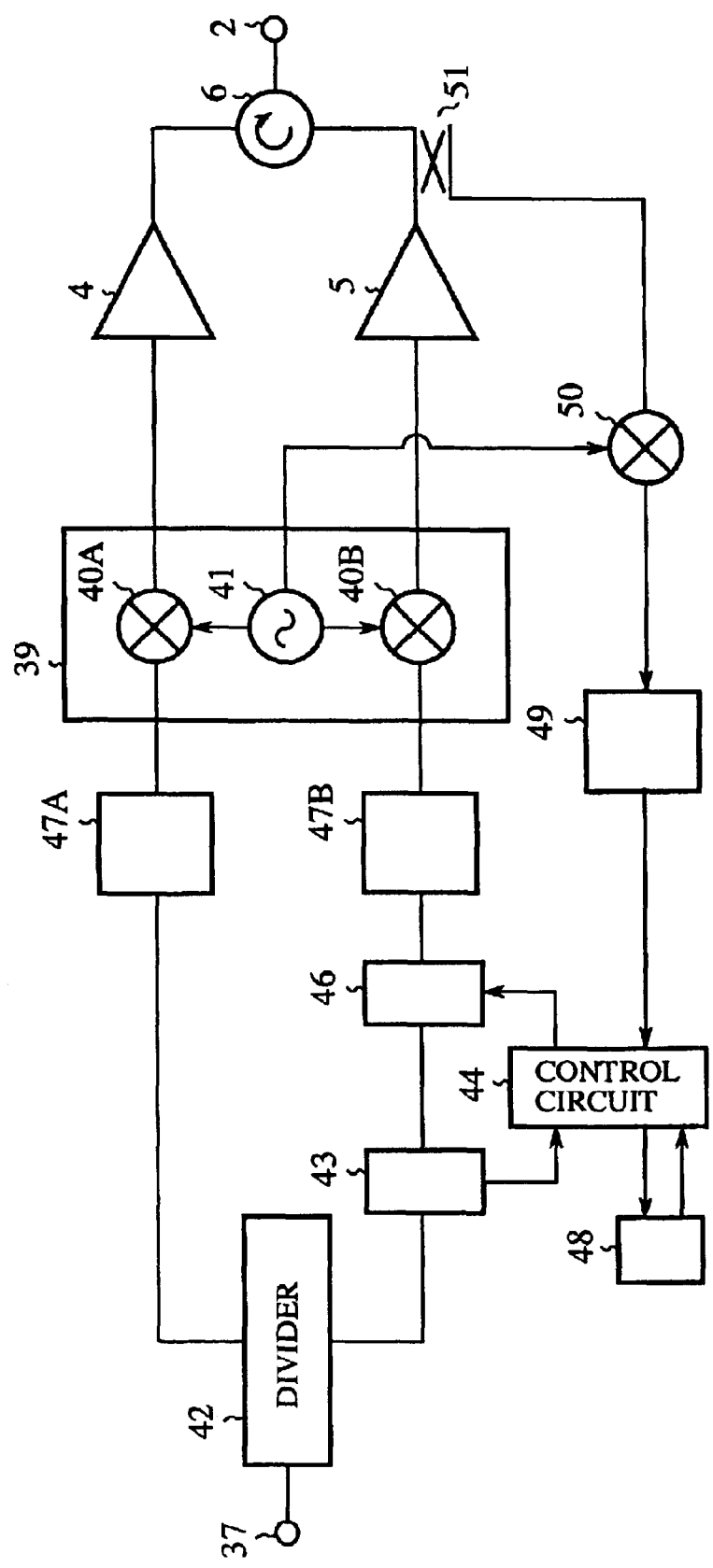
FIG. 24 is a view showing an example in which a portion of a high-frequency signal output from a subsidiary amplifying unit is converted into a base band signal and is fed back to the base band processing circuit.

Also, FIG. 24 is a view showing an example in which a portion of the high-frequency signal output from the subsidiary amplifying unit 5 is converted into a base band signal and is fed back to the base band processing circuit 38. The constituent elements, which are the same as those shown in FIG. 23, are indicated by the same reference numerals as those of the constituent elements shown in FIG. 23.

In FIG. 24, 48 indicates a random access memory (RAM) in which data can be rewritten. 49 indicates an A/D converting unit in which an analog signal is converted into a digital signal. 50 indicates a mixer (or second frequency converting means) in which a high-frequency signal is mixed with a local signal output from the local oscillating unit 41. 51 indicates a divider (or fifth distributing means) in which the high-frequency signal amplified in the subsidiary amplifying unit 5 is divided and distributed to both the circulator 6 and the mixer 50.

A base band signal input to the input terminal 37 is distributed to two lines of two output sides in the divider 42, an instantaneous level of one base band signal distributed to the line of the side of the subsidiary amplifying unit 5 is detected in the level detecting unit 43, the control unit 44 refers to both the detected instantaneous level of the base band signal and data stored in the RAM 48, and the control unit 44 controls the level and phase converting unit 46 to obtain a desired AM-AM/PM characteristic of the base band signal.

Also, a portion of the output of the subsidiary amplifying unit 5 is taken out to the divider 51, a frequency of the output of the subsidiary amplifying unit 5 taken out is changed in the mixer 50, the output of the mixer 50 is converted into a base band signal in the A/D converting unit 49, and the base band signal is input to the control unit 44. In the control unit 44, the desired AM-AM/PM characteristic stored in the RAM 48 is compared with the output of the A/D converting unit 49. Therefore, the control operation of the level and phase converting unit 46 can be adjusted. In this case, data of the RAM 48 is rewritten to optimum data.

As is described above, a portion of the high-frequency signal output from the subsidiary amplifying unit 5 is taken out to the divider 51, the high-frequency signal taken out is converted into the base band signal in the mixer 50 and the A/D converting unit 49, and the data of the RAM 48, to which the control unit 44 refers, is renewed to data of the optimum value by the control unit 44. Accordingly, even though characteristics of the subsidiary amplifying unit 5 are changed due to a change of temperature, an optimum control can be always performed in the high-frequency amplifier, the high-frequency amplifier operated at high efficiency can be obtained. Also, the high-frequency amplifier can be monitored or controlled from a remote place by transmitting data of the RAM 48 to the remote place or receiving data of the RAM 48 from the remote place.

Also, in the same manner as in the sixth embodiment, it is preferred that the bias condition of the subsidiary amplifying unit 5 is adjusted in the control unit 44, and the subsidiary amplifying unit 5 can be used as the fifth amplitude and phase adjusting means.

Also, in FIG. 22, the line of the main amplifying unit 4 and the line of the subsidiary amplifying unit 5 are separated from each other in the base band processing circuit 38. However, it is applicable that the line of the main amplifying unit 4 and the line of the subsidiary amplifying unit 5 be separated from each other in the frequency changing circuit 39 or another circuit following the frequency changing circuit 39.

Embodiment 14

A case where each of the high-frequency amplifiers according to the first to thirteenth embodiments is used for a feed-forward amplifier will be described below.

Figure 25:
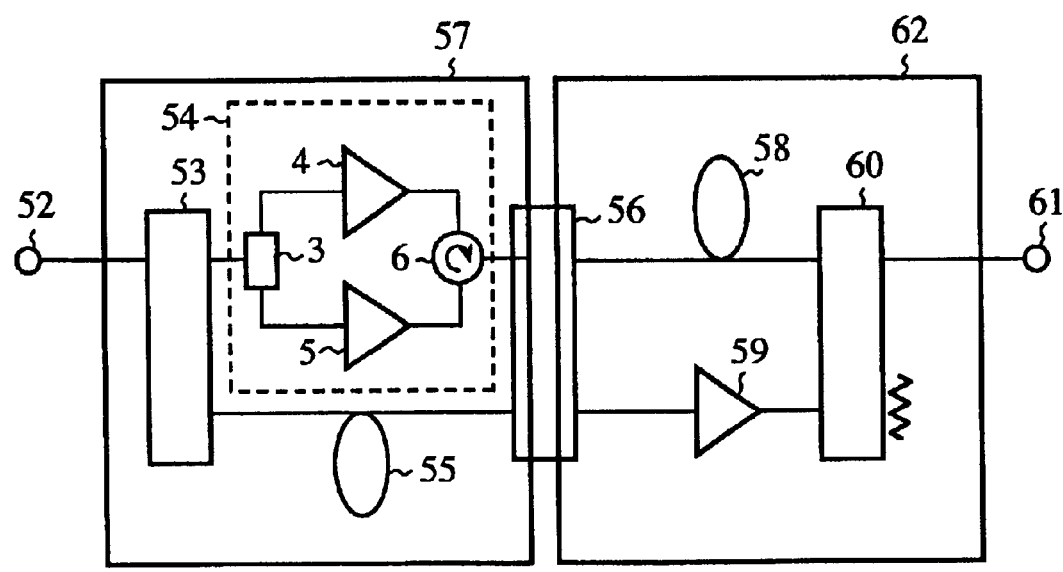
FIG. 25 is a view showing the configuration of a feed-forward amplifier according to a fourteenth embodiment of the present invention.

FIG. 25 is a view showing the configuration of a feed-forward amplifier according to a fourteenth embodiment of the present invention. The constituent elements, which are the same as those shown in FIG. 5, are indicated by the same reference numerals as those of the constituent elements shown in FIG. 5.

In FIG. 25, 52 indicates an input terminal of a feed-forward amplifier. 53 indicates a divider in which a high-frequency signal input to the input terminal 52 is divided and distributed to two lines. 54 indicates a main amplifying unit of the feed-forward amplifier in which the high-frequency signal of one line distributed by the divider 53 is amplified. The main amplifying unit 54 has the configuration described in the first embodiment. 55 indicates a delay circuit in which the high-frequency signal of the other line distributed by the divider 53 is delayed by a delay time. 56 indicates a combining and dividing unit in which the high-frequency signal output from the main amplifying unit 54 and the high-frequency signal output from the delay circuit 55 are combined with each other and the combined high-frequency signal is divided and distributed to two lines. 57 indicates a distortion extracting loop of the feed-forward amplifier. The distortion extracting loop 57 comprises the divider 53, the main amplifying unit 54, the delay circuit 55 and the combining and dividing unit 56.

58 indicates a delay circuit in which the high-frequency signal of one line distributed by the combining and dividing unit 56 is delayed by a delay time. 59 indicates a subsidiary amplifying unit in which the high-frequency signal of the other line distributed by the combining and dividing unit 56 is amplified. 60 indicates a combining unit in which an output of the delay circuit 58 and an output of the subsidiary amplifying unit 59 are combined with each other. 61 indicates an output terminal of the feed-forward amplifier. A high-frequency signal obtained in the combining unit 60 is output through the output terminal 61. 62 indicates a distortion canceling loop of the feed-forward amplifier. The distortion canceling loop 62 comprises the delay circuit 58, the subsidiary amplifying unit 59 and the combining unit 60.

A distortion component extracted in the distortion extracting loop 57 is output as one output of the combining and dividing unit 56, is amplified in the subsidiary amplifying unit 59 and is input to the combining unit 60. The other output of the combining and dividing unit 56 passes through the delay circuit 58 and is combined with an output signal of the subsidiary amplifying unit 59 in the combining unit 60. In this case, the main amplifying unit 54 is adjusted so as to make a distortion component passing the delay circuit 58 have the same amplitude as and an opposite phase to the distortion component amplified in the subsidiary amplifying unit 59, and the distortion compensation is performed in the main amplifying unit 54.

A feed-forward amplifier is used in cases where it is required to amplify a signal having a high peak electric power ratio at low distortion in an amplifier of a mobile communication base station. Therefore, the main amplifying unit 54 arranged in the feed-forward amplifier is, for example, often used in an operation state of the back-off equal to or higher than 10 dB. In cases where the high-frequency amplifier of the first embodiment is used as the main amplifying unit 54, a feed-forward amplifier operated at high frequency and low distortion can be obtained.

In general, though the distortion compensation is effective to reduce a degree of distortion of an amplifier, a value of the saturation electric power of the amplifier cannot be improved. Therefore, it is impossible in the prior art to compensate for the distortion generated by cutting off a peak of an envelope of the modulated wave described in the prior art due to the saturation of the amplifier.

In contrast, in the high-frequency amplifier according to the first embodiment of the present invention, even though the back-off is high, a high-frequency amplifier operated at high efficiency can be obtained. In another point of view, a high-frequency amplifier operated at an improved saturation electric power without lowering the efficiency can be obtained. Therefore, it is very effective to use the high-frequency amplifier of the first embodiment as the main amplifying unit 54 of the feed-forward amplifier. Accordingly, a feed-forward amplifier operated at further low distortion can be obtained.

In FIG. 25, the high-frequency amplifier of the first embodiment is used as the main amplifying unit 54 of the feed-forward amplifier. However, the fourteenth embodiment is not limited to the high-frequency amplifier of the first embodiment, and it is applicable that each of the high-frequency amplifiers of the second to thirteenth embodiments be used as the main amplifying unit 54 of the feed-forward amplifier.

Embodiment 15

Figure 26:
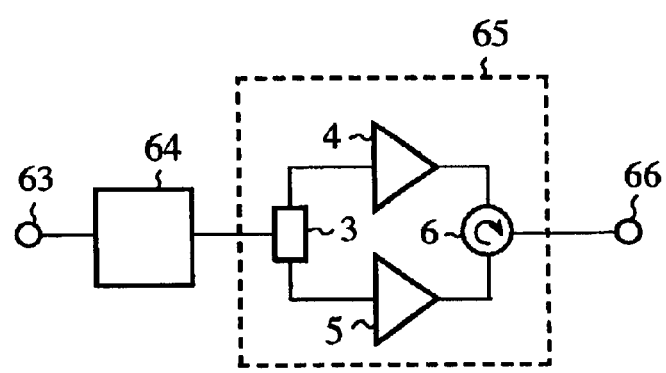
FIG. 26 is a view showing the configuration of a distortion compensating amplifier according to a fifteenth embodiment of the present invention.

FIG. 26 is a view showing the configuration of a distortion compensating amplifier according to a fifteenth embodiment of the present invention. The constituent elements, which are the same as those shown in FIG. 5, are indicated by the same reference numerals as those of the constituent elements shown in FIG. 5.

In FIG. 26, 63 indicates an input terminal of a distortion compensating amplifier. 64 indicates a pre-distortion linearizer (or a distortion linearizer). 65 indicates an amplifying unit formed of the high-frequency amplifier of the first embodiment. 66 indicates an output terminal of the distortion compensating amplifier.

The pre-distortion linearizer 64 arranged between the input terminal 63 and the amplifying unit 65 is formed of a linearizer having a non-linearity opposite to a non-linear distortion characteristic of the amplifying unit 65.

A non-linearity opposite to a non-linear distortion characteristic of the amplifying unit 65 is given to a high-frequency signal input to the input terminal 63 in the pre-distortion linearizer 64, the non-linear distortion characteristic of the amplifying unit 65 is given to the high-frequency signal in the amplifying unit 65, and the high-frequency signal is output from the output terminal 66. Because the non-linearity of the pre-distortion linearizer 64 cancels out the non-linear distortion characteristic of the amplifying unit 65, the high-frequency signal linearly changed can be obtained in the output terminal 66.

For the same reason as that in the fourteenth embodiment, a distortion compensating amplifier operated at high efficiency and low distortion can be obtained by combining each of the high-frequency amplifiers of the first to thirteenth embodiments and the pre-distortion linearizer 64.

It is applicable that a post-distortion linearizer (or a distortion linearizer) having a non-linearity opposite to the non-linear distortion characteristic of the amplifying unit 65 be arranged between the amplifying unit 65 and the output terminal 66 in place of the pre-distortion linearizer 64.

Embodiment 16

In a sixteenth embodiment, a measuring operation performed to ascertain the operation and effect in the high-frequency amplifier of the present invention will be described below with results of the measuring operation.

Figure 27:
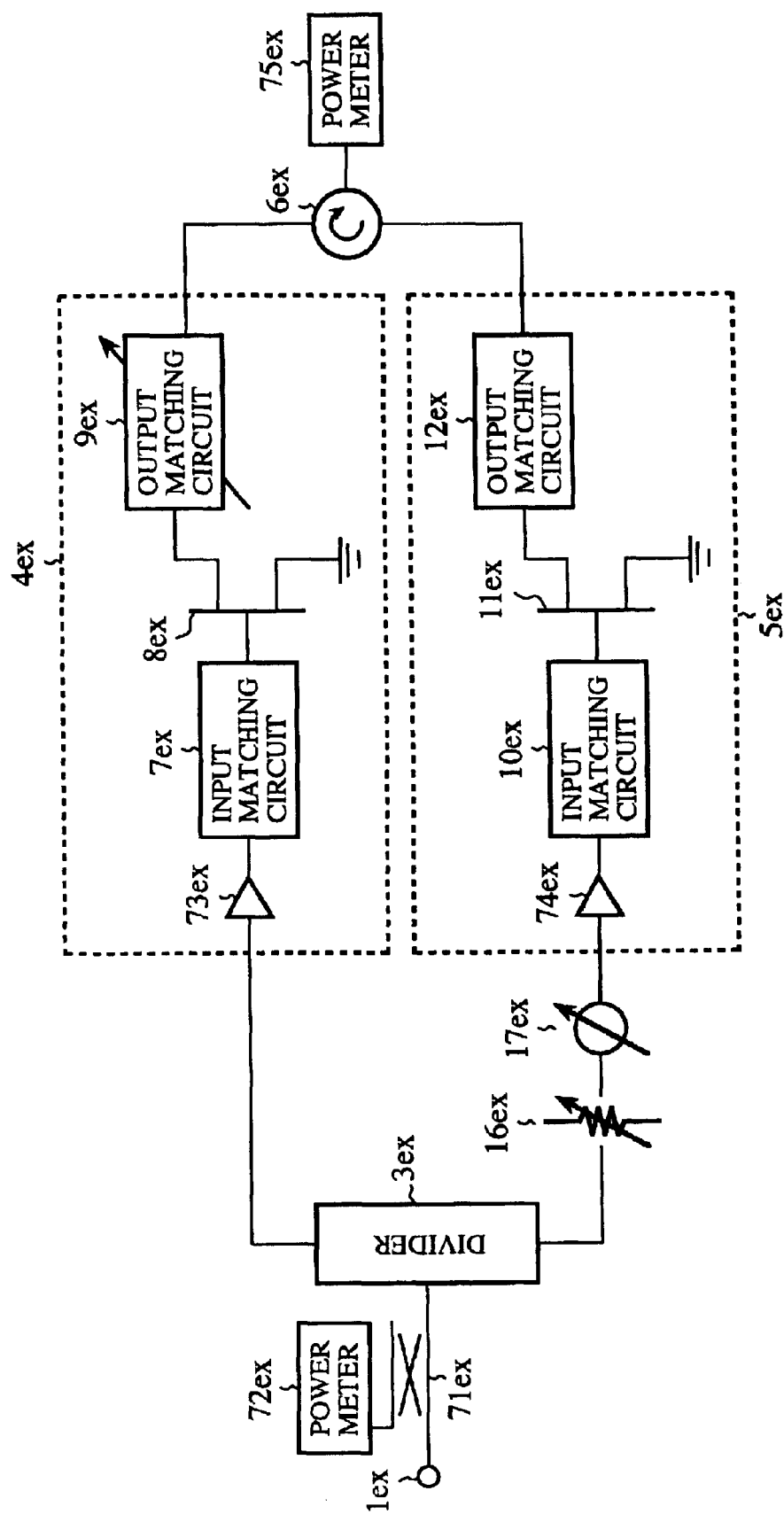
FIG. 27 is a view showing the configuration of a high-frequency amplifier according to a sixteenth embodiment of the present invention.

FIG. 27 is a view showing the configuration of a high-frequency amplifier according to the sixteenth embodiment of the present invention. A high-frequency amplifier shown in FIG. 27 is produced as an example, while particularly considering the high-frequency amplifier of the first embodiment, to describe the operation and effect of the present invention.

In FIG. 27, 1ex indicates an input terminal to which a high-frequency signal is input. 71ex indicates a coupler in which a portion of the electric power of the high-frequency signal input to the input terminal 1 is taken out to measure an input electric power of the input high-frequency signal. 72ex indicates a power meter in which the electric power of the high-frequency signal taken out by the coupler 71ex is measured. 3ex indicates a divider in which the high-frequency signal input to the input terminal 1ex is divided and distributed to two lines of two output sides. The divider 3ex is equivalent to the divider 3 of the first embodiment.

4ex indicates a main amplifying unit equivalent to the main amplifying unit 4 (refer to FIG. 5 or FIG. 6) of the first embodiment. In the main amplifying unit 4ex, 73ex indicates a driver amplifier composing a driver stage of the main amplifying unit 4ex. 7ex indicates an input matching circuit of a final-stage FET. 8ex indicates an FET composing the final stage of the main amplifying unit 4ex. 9ex indicates an output matching circuit.

The output matching circuit 9ex is formed of a manual type variable tuner, a load impedance for the FET 8ex can be manually changed for a measuring operation.

5ex indicates a subsidiary amplifying unit equivalent to the subsidiary amplifying unit 5 (refer to FIG. 5 or FIG. 6) of the first embodiment. In the subsidiary amplifying unit 5ex, 74ex indicates a driver amplifier composing a driver stage of the subsidiary amplifying unit 5ex. 10ex indicates an input matching circuit of a final-stage FET. 11ex indicates an FET composing the final stage of the subsidiary amplifying unit 5ex. 12ex indicates an output matching circuit.

6ex indicates a circulator which injects an output of the subsidiary amplifying unit 5ex into an output side of the main amplifying unit 4ex, and the circulator 6ex is equivalent to the circulator 6 (refer to FIG. 5 or FIG. 6) of the first embodiment.

Also, 16ex and 17ex respectively indicate a variable attenuation unit and a variable phase shift unit arranged between the divider 3ex and the subsidiary amplifying unit 5ex. The variable attenuation unit 16ex and the variable phase shift unit 17ex are equivalent to the variable attenuation unit 16 and the variable phase shift unit 17 (refer to FIG. 9) of the fourth embodiment respectively. The variable attenuation unit 16ex and the variable phase shift unit 17ex adjust an amplitude and a phase of the high-frequency signal passing a line on the side of the subsidiary amplifying unit 5ex. 75ex indicates a power meter in which the electric power of the high-frequency signal output from the circulator 6ex is measured.

MGFS36V produced by Mitsubishi Electric Corporation is used as the FET 8ex arranged in the final stage of the main amplifying unit 4ex, and MGFS32 produced by Mitsubishi Electric Corporation is used as the FET 11ex arranged in the final stage of the subsidiary amplifying unit 5ex. Each of the FET 8ex and the FET 11ex is formed of a general GaAsFET used for the microwave band.

Also, MGF7122A produced by Mitsubishi Electric Corporation denoting GaAsMMIC of a three-stage amplifier is used for each of the driver amplifier 73ex of the main amplifying unit 4ex and the driver amplifier 74ex of the subsidiary amplifying unit 5ex, and the GaAsMMIC is formed of a general MMIC used for the microwave band amplifier.

In addition, the output matching circuit 9ex denoting a manual type variable tuner and the circulator 6ex are put on the market as micro wave circuits generally used and can be obtained from MAURY microwave Corporation or TRAK microwave Corporation.

The FET 8ex of the final stage of the main amplifying unit 4ex is biased at the class-AB (or at a current of 280 mA in case of no signal). In contrast, the FET 11ex of the final stage of the subsidiary amplifying unit 5ex is biased at the class-C (or at a current of 0 mA in case of no signal). A measuring operation described below is performed at the frequency of 1.9 GHz.

Initially, the subsidiary amplifying unit 5ex is not operated, only the main amplifying unit 4ex is operated, and the saturation electric power and efficiency in the high-frequency amplifier shown in FIG. 27 are measured. That is, to ascertain the problem in the conventional high-frequency amplifier, a measuring operation is performed in a case where the output matching circuit 9ex of the main amplifying unit 4ex is fixed to a load impedance condition "A" (hereinafter, simply called a load condition "A") in which the saturation electric power is heightened, and a measuring operation is performed in a case where the output matching circuit 9ex of the main amplifying unit 4ex is fixed to a load impedance condition "B" (hereinafter, simply called a load condition "B") in which the efficiency becomes excellent in case of small signal.

Figure 28:
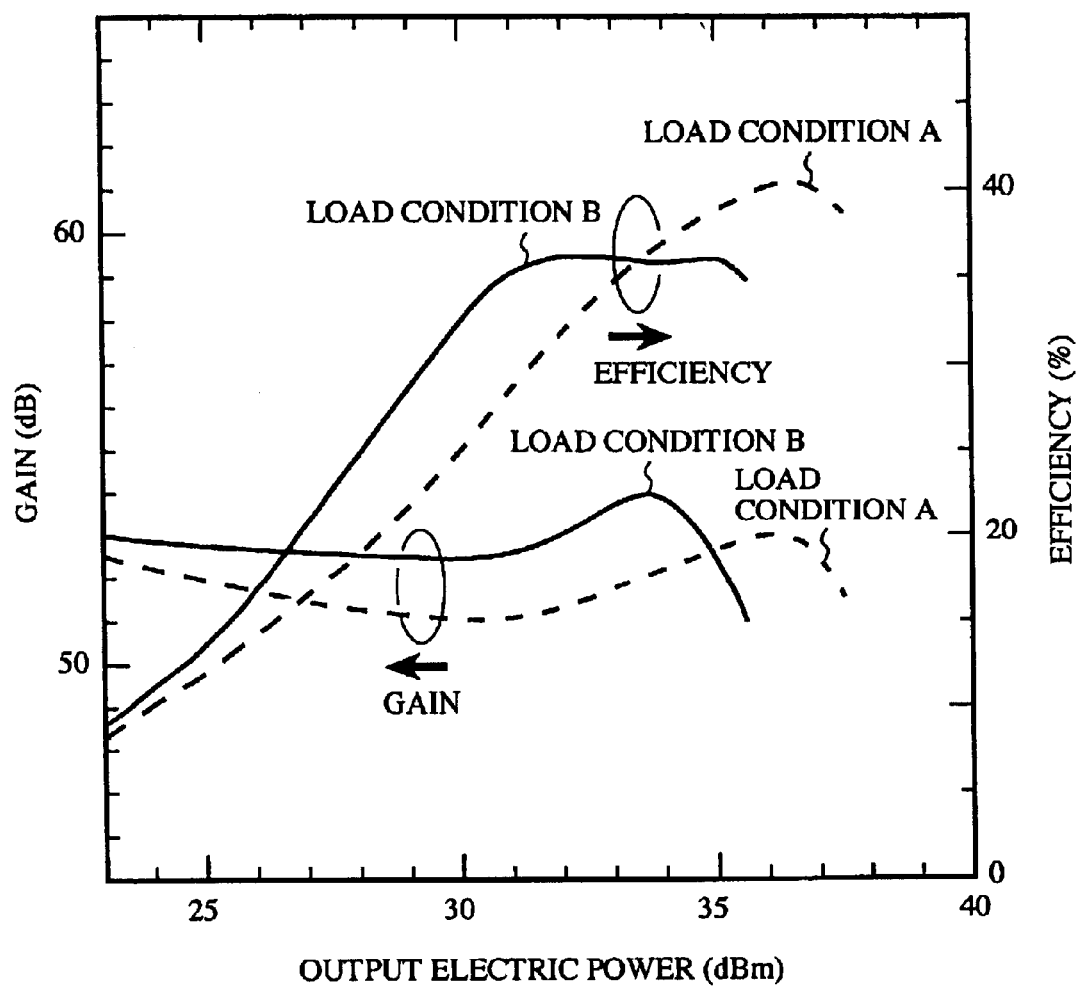
FIG. 28 is a view showing a measurement result obtained in cases where the subsidiary amplifying unit is not operated in the high-frequency amplifier shown in FIG. 27.

FIG. 28 shows results of the measuring operation. The output electric power is indicated on an X axis in dBm, and the gain (Y axis on the left side, output electric power—input electric power, dB) and the efficiency (Y axis on the right side, %) with respect to the output electric power are graphed.

As is realized in FIG. 28, on the load condition "A" corresponding to the high saturation electric power, the saturation electric power (indicated in FIG. 28 by the output electric power at which the gain is rapidly lowered) of 37.2 dBm is obtained. In this load condition "A", the efficiency is equal to 25% in case of the low output electric power, for example, the output electric power of 30 dBm (back-off of 7.2 dB).

In contrast, on the load condition "B" corresponding to the excellent efficiency in the small signal, the efficiency is equal to 32% in case of the output electric power of 30 dB, but the saturation electric power is lowered to 35.5 dBm.

That is to say, in cases where the conventional high-frequency amplifier is operated on the load condition "A" corresponding to the high saturation electric power, the efficiency is lowered in the small signal. Also, in cases where the conventional high-frequency amplifier is operated on the load condition "B" corresponding to the excellent efficiency in the small signal, the saturation electric power runs short. Therefore, the results indicating the problem in the prior art are obtained.

Figure 29:
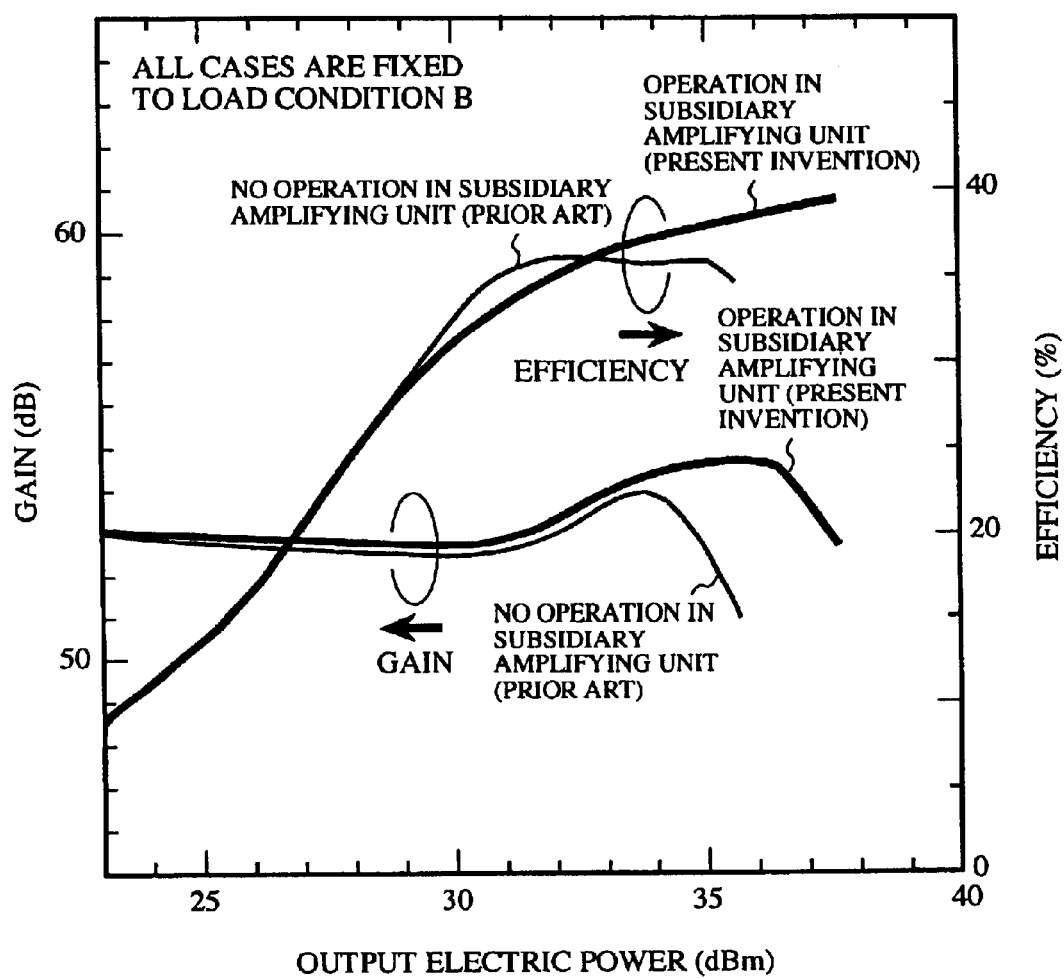
FIG. 29 is a view showing the comparison of a measurement result obtained by operating the subsidiary amplifying unit in the high-frequency amplifier shown in FIG. 27 with a measurement result obtained in cases where the subsidiary amplifying unit is not operated in the high-frequency amplifier.

Next, the load impedance condition of the output matching circuit 9ex is fixed to the load condition "B" corresponding to the excellent efficiency in the small signal, the subsidiary amplifying unit 5ex biased at class-C is operated, and a measuring operation is performed. This case corresponds to the high-frequency amplifier of the present invention. Results of the measuring operation are shown in FIG. 29. In the same manner as in FIG. 28, an X axis indicates the output electric power, and the gain (Y axis on the left side) and the efficiency (Y axis on the right side) with respect to the output electric power are graphed. Conventional characteristics in case of no operation of the subsidiary amplifying unit 5ex are shown with characteristics in the high-frequency amplifier of the present invention.

At the output electric power of 30 dB or less, the subsidiary amplifying unit 5ex is set to an "off" state, and no output electric power is generated in the subsidiary amplifying unit 5ex. Therefore, characteristics in the present invention obtained in a case where the subsidiary amplifying unit 5ex is operated are the same as the prior art obtained in a case where the subsidiary amplifying unit 5ex is not operated.

Thereafter, when the output electric power exceeds 30 dB, as is described in the first embodiment, the subsidiary amplifying unit 5ex is set to an "on" state, an output electric power is generated in the subsidiary amplifying unit 5ex, and the output electric power is injected into the output side of the main amplifying unit 4ex through the circulator 6ex. Because of the injected electric power, the apparent impedance is changed, and the saturation electric power is increased.

In this case, the saturation electric power is equal to 37.5 dBm, and almost the same saturation electric power as that on the load condition "A" shown in FIG. 28 corresponding to a case of maximizing the saturation electric power can be obtained. Here, the efficiency shown in FIG. 29 denotes a value including an electric power consumed in the subsidiary amplifying unit 5ex.

Accordingly, the saturation electric power of 37.5 dBm equivalent to that on the load condition (the load condition "A" in FIG. 28) heightening the saturation electric power can be obtained, and an effect is ascertained that the efficiency can be improved from 25% to 32%, for example, in an back-off operation of the output electric power of 30 dBm.

According to the above-described measuring operation, an excellent effect of the present invention is clarified that the efficiency in the small signal, that is, in the back-off operation can be improved while heightening the saturation electric power by using both the subsidiary amplifying unit 5ex biased at class-C and the circulator 6ex arranged on the output side in the present invention.

As is described above, as the object of the present invention, the provision of the high-frequency amplifier, in which the demodulated wave having a high peak electric power ratio is amplified at high efficiency, that is, the demodulated wave is amplified at high efficiency even in high back-off state, is described as the object. However, because a change-over of the load impedance in the high-frequency amplifier of the present invention is performed at sufficiently high speed so as to shorten the change-over time, the high-frequency amplifier of the present invention is adaptable for the main object in the prior art (the method of changing over in the switch arranged in the matching circuit). In other words, the high-frequency amplifier of the present invention is adaptable for the object in which the change-over between the high output power mode and the low output power mode in the high-frequency amplifier is performed and the operation is performed at high efficiency in any mode.

In the prior art, it is difficult to use a switch and a variable element which have characteristics of the electric power resistance and low loss so as to be usable for the output circuit of the high-frequency amplifier. As a result, a problem has arisen that the improvement of the efficiency is low. However, the circulator and the 90-degree hybrid used in the present invention generally have characteristics of a sufficient electric power resistance and low loss. As a result, in the present invention, the high-frequency amplifier stably operated at the excellent efficiency can be provided.

INDUSTRIAL APPLICABILITY

As is described above, the high-frequency amplifier, the feed-forward amplifier and the distortion compensating amplifier according to the present invention are appropriate for the high-frequency amplifying system operated at high efficiency even in the high back-off operating state.

What is claimed is:

1. A high-frequency amplifier, comprising:
   subsidiary amplifying means for performing an amplifying operation for a high-frequency signal distributed and input only in a case where an instantaneous electric power of the high-frequency signal is high; and
   main amplifying means for always performing an amplifying operation for a high-frequency signal distributed and input,
   wherein the high-frequency signal amplified by the subsidiary amplifying means is injected into an output side of the main amplifying means, and the high-frequency signal amplified by the main amplifying means is output.

2. A high-frequency amplifier, comprising:
   first distributing means for distributing a high-frequency signal input from an input terminal;
   main amplifying means for always preforming an amplifying operation for one high-frequency signal distributed by the first distributing means;
   subsidiary amplifying means for performing an amplifying operation for the other high-frequency signal distributed by the first distributing means only in a case where an instantaneous electric power of the high-frequency signal is high; and
   a circulator for injecting the high-frequency signal amplified by the subsidiary amplifying means into an output side of the main amplifying means and outputting the high-frequency signal amplified by the main amplifying means through an output terminal.

3. A high-frequency amplifier, comprising:
   first distributing means for distributing a high-frequency signal input from an input terminal to two lines;
   second distributing means for producing two high-frequency signals having a phase difference of 90 degrees from each other from the high-frequency signal of one line distributed by the first distributing means and distributing the two high-frequency signals;

first main amplifying means for always performing an amplifying operation for one high-frequency signal distributed by the second distributing means;

second main amplifying means for always performing an amplifying operation for the other high-frequency signal distributed by the second distributing means;

subsidiary amplifying means for amplifying the high-frequency signal of the other line distributed by the first distributing means only in a case where an instantaneous electric power of the high-frequency signal is high; and a first 90-degree hybrid for injecting the high-frequency signal amplified by the subsidiary amplifying means into both an output side of the first main amplifying means and an output side of the second main amplifying means, combining the high-frequency signal amplified by the first main amplifying means and the high-frequency signal amplified by the second main amplifying means and outputting a combined high-frequency signal through an output terminal.

4. A high-frequency amplifier according to claim 2, further comprising:

first amplitude and phase adjusting means for adjusting both an amplitude and a phase of the high-frequency signal passing through the subsidiary amplifying means.

5. A high-frequency amplifier according to claim 3, further comprising:

first amplitude and phase adjusting means for adjusting both an amplitude and a phase of the high-frequency signal passing through the subsidiary amplifying mean.

6. A high-frequency amplifier according to claim 2, further comprising:

delaying means for delaying either the high-frequency signal passing through the main amplifying means or the high-frequency signal passing through the subsidiary amplifying means by a delay time.

7. A high-frequency amplifier according to claim 3, further comprising:

delaying means for delaying either both the high-frequency signal passing through the first main amplifying means and the high-frequency signal passing through the second main amplifying means or the high-frequency signal passing through the subsidiary amplifying means by a delay time.

8. A high-frequency amplifier according to claim 2, further comprising:

a frequency equalizer for changing either a frequency characteristic of the high-frequency signal passing through the main amplifying means or a frequency characteristic of the high-frequency signal passing through the subsidiary amplifying means.

9. A high-frequency amplifier according to claim 3, further comprising:

a frequency equalizer for changing either both a frequency characteristic of the high-frequency signal passing through the first main amplifying means and a frequency characteristic of the high-frequency signal passing through the second main amplifying means or a frequency characteristic of the high-frequency signal passing through the subsidiary amplifying means.

10. A high-frequency amplifier according to claim 2, further comprising:

AM-AM/PM adjusting means for adjusting both a change of the instantaneous electric power and a passing phase characteristic of the high-frequency signal output from the subsidiary amplifying means according to a change of the instantaneous electric power of the high-frequency signal input to the subsidiary amplifying means.

11. A high-frequency amplifier according to claim 3, further comprising:

AM-AM/PM adjusting means for adjusting both a change of the instantaneous electric power and a passing phase characteristic of the high-frequency signal output from the subsidiary amplifying means according to a change of the instantaneous electric power of the high-frequency signal input to the subsidiary amplifying means.

12. A high-frequency amplifier according to claim 2, further comprising:

demultiplexing means for demultiplexing a fundamental wave component and a harmonic wave component of the high-frequency signal amplified by the subsidiary amplifying means from each other;

third amplitude and phase adjusting means for adjusting both an amplified and a phase of the harmonic wave component demultiplexed by the demultiplexing means; and multiplexing means, disposed between the demultiplexing means and the circulator, for multiplexing the fundamental wave component demultiplexed by the demultiplexing means and the harmonic wave component adjusted by the third amplitude and phase adjusting means with each other.

13. A high-frequency amplifier according to claim 3, further comprising:

demultiplexing means for demultiplexing a fundamental wave component and a harmonic wave component of the high-frequency signal amplified by the subsidiary amplifying means from each other;

third amplitude and phase adjusting means for adjusting both an amplitude and a phase of the harmonic wave component demultiplexed by the demultiplexing means; and multiplexing means, disposed between the demultiplexing means and the first 90-degree hybrid, for multiplexing the fundamental wave component demultiplexed by the demultiplexing means and the harmonic wave component adjusted by the third amplitude and phase adjusting means with each other.

14. A high-frequency amplifier according to claim 2, further comprising:

demultiplexing means for demultiplexing a fundamental wave component and a harmonic wave component of the high-frequency signal amplified by the subsidiary amplifying means from each other;

third amplitude and phase adjusting means for adjusting both an amplitude and a phase of the harmonic wave component demultiplexed by the demultiplexing means; and multiplexing means, disposed between the circulator and the subsidiary amplifying means, for multiplexing the fundamental wave component demultiplexed by the demultiplexing means and the harmonic wave component adjusted by the third amplitude and phase adjusting means with each other.

15. A high-frequency amplifier according to claim 3, further comprising:

demultiplexing means for demultiplexing a fundamental wave component and a harmonic wave component of the high-frequency signal amplified by the subsidiary amplifying means from each other and outputting the fundamental wave component to the first 90-degree hybrid;

third amplitude and phase adjusting means for adjusting both an amplitude and a phase of the harmonic wave component demultiplexed by the demultiplexing means;

a second 90-degree hybrid for distributing the harmonic wave component adjusted by the third amplitude and phase adjusting means to two lines;

first multiplexing means, disposed between the first 90-degree hybrid and the first main amplifying means, for multiplexing the harmonic wave component of one line output from the second 90-degree hybrid and the fundamental wave component output through the first 90-degree hybrid with each other; and second multiplexing means, disposed between the first 90-degree hybrid and the second main amplifying means, for multiplexing the harmonic wave component of the other line output from the second 90-degree hybrid and the fundamental wave component output through the first 90-degree hybrid with each other.

16. A high-frequency amplifier according to claim 2, further comprising:

an isolator, disposed between the subsidiary amplifying means and the circulator, for making the high-frequency signal amplified by the subsidiary amplifying means pass through the circulator.

17. A high-frequency amplifier according to clam 3, further comprising:

an isolator, disposed between the subsidiary amplifying means and the first 90-degree hybrid, for making the high-frequency signal amplified by the subsidiary amplifying means pass through the first 90-degree hybrid.

18. A high-frequency amplifier according to claim 2, further comprising:

base band processing means for processing a base band signal input from the input terminal; and first frequency changing means for changing a frequency of the base band signal processed by the base band processing means to produce both the high-frequency signal input to the main amplifying means and the high-frequency signal input to the subsidiary amplifying means.

19. A high-frequency amplifier according to claim 3, further comprising:

base band processing means for processing a base band signal input from the input terminal; and first frequency changing means for changing a frequency of the base band signal processed by the base band processing means to produce both the high-frequency signal input to the main amplifying means and the high-frequency signal input to the subsidiary amplifying means.

20. A high-frequency amplifier according to claim 18, wherein the base band processing means comprises:

fourth distributing means for distributing the base band signal input from the input terminal to two lines;

second amplitude detecting means for detecting an amplitude of the base band signal of one line distributed by the fourth distributing means;

fourth amplitude and phase adjusting means for adjusting both an amplitude and a phase of the base band signal output from the second amplitude detecting means; and control means for controlling the fourth amplitude and phase adjusting means by referring to both the amplitude of the base band signal detected by the second amplitude detecting means and data prepared in advance.

21. A high-frequency amplifier according to claim 19, wherein the base band processing means comprises:

fourth distributing means for distributing the base band signal input from the input terminal as two lines;

second amplitude detecting means for detecting an amplitude of the base band signal of one line distributed by the fourth distributing means;

fourth amplitude and phase adjusting means for adjusting both an amplitude and a phase of the base band signal output from the second amplitude detecting means; and control means for controlling the fourth amplitude and phase adjusting means by referring to both the amplitude of the base band signal detected by the second amplitude detecting means and data prepared in advance.

22. A high-frequency amplifier according to claim 20, further comprising:

fifth distributing means for distributing the high-frequency signal output from the subsidiary amplifying means; and second frequency changing means for changing a frequency of the high-frequency signal distributed by the fifth distributing means to produce a base band signal, wherein the control means renews data prepared in advance by referring to the base band signal of which the frequency is changed by the second frequency changing means.

23. A high-frequency amplifier according to claim 21, further comprising:

fifth distributing means for distributing the high-frequency signal output from the subsidiary amplifying means; and second frequency changing means for changing a frequency of the high-frequency signal distributed by the fifth distributing means to produce a base band signal, wherein the control means renews data prepared in advance by referring to the base band signal of which the frequency is changed by the second frequency changing means.

\* \* \* \* \*